United States Patent
Laurent

(10) Patent No.: US 11,355,162 B2
(45) Date of Patent: Jun. 7, 2022

(54) ACTIVE BOUNDARY QUILT ARCHITECTURE MEMORY

(71) Applicant: Micron Technology, Inc., Boise, ID (US)

(72) Inventor: Christophe Vincent Antoine Laurent, Agrate Brianza (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/006,155

(22) Filed: Aug. 28, 2020

(65) Prior Publication Data

US 2020/0395050 A1 Dec. 17, 2020

Related U.S. Application Data

(63) Continuation of application No. 16/189,447, filed on Nov. 13, 2018, now Pat. No. 10,818,323, which is a (Continued)

(51) Int. Cl.
*G11C 5/06* (2006.01)
*G11C 5/02* (2006.01)
(Continued)

(52) U.S. Cl.
CPC .......... *G11C 5/025* (2013.01); *G11C 8/10* (2013.01); *H01L 27/0207* (2013.01);
(Continued)

(58) Field of Classification Search
CPC .......... G11C 5/025; G11C 5/063; G11C 5/05; G11C 7/18; G11C 11/4097
(Continued)

(56) References Cited

U.S. PATENT DOCUMENTS 6,069,812 A 5/2000 Lee et al.
6,567,287 B2 5/2003 Scheuerlein
(Continued)

FOREIGN PATENT DOCUMENTS

JP 2002530850 A 9/2002
JP 2006514440 A 4/2006
(Continued)

OTHER PUBLICATIONS

Japan Patent Office, "Notice of Rejection Ground," issued in connection with Japanese Patent Application No. 2019-543840, dated Apr. 20, 2021 (15 pages).
(Continued)

*Primary Examiner* — Son T Dinh
(74) *Attorney, Agent, or Firm* — Holland & Hart LLP

(57) ABSTRACT

Methods, systems, and apparatus that increase available memory or storage using active boundary areas in quilt architecture are described. A memory array may include memory cells overlying each portion of a substrate layer that includes certain types of support circuitry, such as decoders and sense amplifiers. Active boundary portions, which may be elements of the memory array having a different configuration from other portions of the memory array, may be positioned on two sides of the memory array and may increase available data in a quilt architecture memory. The active boundary portions may include support components to access both memory cells of neighboring memory portions and memory cells overlying the active boundary portions. Address scrambling may produce a uniform increase in number of available data in conjunction with the active boundary portions.

20 Claims, 22 Drawing Sheets

Related U.S. Application Data continuation of application No. 15/690,895, filed on Aug. 30, 2017, now Pat. No. 10,157,643, which is a continuation of application No. 15/434,401, filed on Feb. 16, 2017, now Pat. No. 9,792,958.

(51) Int. Cl.
| | | |
|---|---|---|
| *G11C 8/10* | (2006.01) | |
| *H01L 45/00* | (2006.01) | |
| *H01L 27/24* | (2006.01) | |
| *H01L 27/02* | (2006.01) | |
| *G11C 7/06* | (2006.01) | |

(52) U.S. Cl.
CPC .......... *H01L 27/2427* (2013.01); *H01L 45/06* (2013.01); *G11C 7/062* (2013.01)

(58) Field of Classification Search
USPC ...................................................... 365/63, 51
See application file for complete search history.

(56) References Cited

U.S. PATENT DOCUMENTS

| | | | |
|---|---|---|---|
| 6,760,253 B2 | 7/2004 | Kamei | |
| 7,190,602 B2 | 3/2007 | Johnson et al. | |
| 7,227,767 B2 | 6/2007 | Rinerson et al. | |
| 7,272,070 B2 | 9/2007 | Hummler | |
| 7,551,477 B2 * | 6/2009 | Mokhlesi | G11C 7/12 365/185.11 |
| 7,750,430 B2 | 7/2010 | Jang | |
| 8,310,854 B2 | 11/2012 | MacWilliams et al. | |
| 8,508,975 B2 | 8/2013 | Toba et al. | |
| 8,873,271 B2 | 10/2014 | Lam et al. | |
| 8,891,280 B2 | 11/2014 | Castro et al. | |
| 9,025,398 B2 | 5/2015 | Flores et al. | |
| 9,190,144 B2 | 11/2015 | Castro et al. | |
| 9,355,718 B2 | 5/2016 | Flores et al. | |
| 9,378,774 B2 | 6/2016 | Castro et al. | |
| 9,748,337 B2 | 8/2017 | Kobayashi et al. | |
| 9,792,958 B1 | 10/2017 | Laurent | |
| 10,157,643 B2 | 12/2018 | Laurent | |
| 10,510,407 B2 | 12/2019 | Laurent | |
| 2002/0141233 A1 | 10/2002 | Hosotani et al. | |
| 2002/0163834 A1 | 11/2002 | Scheuerlein | |
| 2005/0105371 A1 | 5/2005 | Johnson et al. | |
| 2006/0133186 A1 | 6/2006 | Hummler | |
| 2008/0304308 A1 | 12/2008 | Stipe | |
| 2009/0108394 A1 | 4/2009 | Jang | |
| 2010/0038616 A1 | 2/2010 | Nagashima et al. | |
| 2011/0188282 A1 | 8/2011 | Chevallier et al. | |
| 2012/0075902 A1 | 3/2012 | Macwilliams et al. | |
| 2013/0148411 A1 | 6/2013 | Atsumi et al. | |
| 2014/0239512 A1 | 8/2014 | Pellizzer et al. | |
| 2014/0372713 A1 | 12/2014 | Castro et al. | |
| 2016/0035418 A1 | 2/2016 | Castro et al. | |
| 2016/0134288 A1 | 5/2016 | Madurawe | |
| 2016/0247565 A1 | 8/2016 | Perner et al. | |
| 2016/0267984 A1 | 9/2016 | Tanzawa | |
| 2016/0268268 A1 | 9/2016 | Kobayashi et al. | |
| 2016/0293232 A1 | 10/2016 | Ishizu et al. | |
| 2016/0351233 A1 | 12/2016 | Castro et al. | |
| 2017/0358334 A1 | 12/2017 | Onuki | |
| 2018/0122686 A1 | 5/2018 | Or-bach et al. | |
| 2020/0141233 A1 | 5/2020 | Allouche et al. | |

FOREIGN PATENT DOCUMENTS

| | | |
|---|---|---|
| JP | 2007-536680 A | 12/2007 |
| JP | 2010020863 A | 1/2010 |
| JP | 2010045205 A | 2/2010 |
| JP | 2010282673 A | 12/2010 |
| JP | 2012-256820 A | 12/2012 |
| JP | 2013168631 A | 8/2013 |
| JP | 2016213493 A | 12/2016 |
| JP | 2016540370 A | 12/2016 |
| KR | 20090027561 A | 3/2009 |
| KR | 20110127193 A | 11/2011 |
| WO | 2009031336 A1 | 3/2009 |
| WO | 2013018281 A1 | 2/2013 |
| WO | 2016/047254 A1 | 3/2016 |

OTHER PUBLICATIONS

European Patent Office, "European Search Report," issued in connection with European Patent Application No. 18754065.3, dated Nov. 9, 2020 (8 pages).

European Patent Office, "European Search Report," issued in connection with European Patent Application No. 17896968.9, dated Oct. 30, 2020 (8 pages).

Japanese Patent Office, "Notice of Rejection Ground," issued in connection with Japanese Patent Application No. 2019-543840, dated Oct. 6, 2020 (16 pages).

Japanese Patent Office, "Notice of Rejection," issued in connection with Japanese Patent Application No. 2019-543777, dated Sep. 8, 2020 (10 pages).

The Korean Intellectual Property Office, "Notice of Reasons for Rejection," issued in connection with Korean Patent Application No. 10-2019-7025763, dated Aug. 27, 2019 (5 pages).

Intellectual Property Office of Singapore, "Written Opinion," issued in connection with Application No. 11201907532V, dated Jul. 28, 2020 (8 pages).

IPO, "Office Action," issued in connection with ROC (Taiwan) Patent Application No. 107105123, dated Dec. 13, 2018 (3 pages).

ISA/KR, International Search Report and Written opinion of the International Searching Authority, Int'l. Appl. No. PCT/US2017/049441, dated Dec. 11, 2017, Korean Intellectual Property Office, Seo-gu, Daejeon, Republic of Korea, 17 pgs.

ISA/KR, International Search Report and Written Opinion of the International Searching Authority, Int'l. Appl. No. PCT/US2018/017204, dated May 15, 2018, Korean Intellectual Property Office, Daejeon, Republic of Korea, 16 pgs.

Japanese Patent Office, "Notice of Rejection", Issued in connection with Japanese Patent Application No. 2019-543777, dated Mar. 3, 2020 (12 pages).

The Korean Intellectual Property Office, "Notice of Reasons for Rejection," issued in connection with Korean Patent Application No. 10-2019-7026300, dated Oct. 14, 2019 (4 pages).

Korea Patent Office, "Notice of Allowance," issued in connection with Korea Patent Application No. 10-2019-7025763, dated Sep. 9, 2021 (4 pages).

Japan Patent Office, "Notice of Rejection Ground", issued in connection with Japan Patent Application No. 2021-075896, dated Apr. 12, 2022 (14 pages).

* cited by examiner

2205 — Identify at least one cell of an array of memory cells that overlies a first boundary portion and a second boundary portion of a substrate layer, where memory cells of the array are coupled with a first plurality of decoders of the first boundary portion, a second plurality of decoders of the second boundary portion, and a third plurality of decoders of a core portion of the substrate layer via a plurality of access lines, and where the first plurality of decoders includes a plurality of column decoders associated with memory cells of the array that overlie the first boundary portion and the second plurality of decoders includes a plurality of column decoders associated with memory cells of the array that overlie the second boundary portion

2210 — Access the at least one cell using one of the first plurality of decoders of the first boundary portion, one of the second plurality of decoders of the second boundary portion, or one of the third plurality of decoders of the core portion in conjunction with a column decoder of a boundary portion above which the at least one cell is located

ACTIVE BOUNDARY QUILT ARCHITECTURE MEMORY

CROSS REFERENCE

The present Application for Patent is a continuation of U.S. patent application Ser. No. 16/189,447 by Laurent, entitled "Active Boundary Quilt Architecture Memory," filed Nov. 13, 2018, which is a continuation of U.S. patent application Ser. No. 15/690,895 by Laurent, entitled "Active Boundary Quilt Architecture Memory," filed Aug. 30, 2017, which is a continuation of U.S. patent application Ser. No. 15/434,401 by Laurent, entitled "Active Boundary Quilt Architecture Memory," filed Feb. 16, 2017, assigned to the assignee hereof, and each of which is expressly incorporated by reference in its entirety herein.

BACKGROUND

The following relates generally to memory devices and more specifically to active boundary quilt architecture memory.

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, the electronic device may read, or sense, the stored state in the memory device. To store information, the electronic device may write, or program, the state in the memory device.

Multiple types of memory devices exist, including magnetic hard disks, random access memory (RAM), dynamic RAM (DRAM), synchronous dynamic RAM (SDRAM), ferroelectric RAM (FeRAM), magnetic RAM (MRAM), resistive RAM (RRAM), read only memory (ROM), flash memory, phase change memory (PCM), and others. Memory devices may be volatile or non-volatile. Non-volatile memory, e.g., FeRAM and PCM, may maintain their stored logic state for extended periods of time even in the absence of an external power source. Volatile memory devices, e.g., DRAM, may lose their stored state over time unless they are periodically refreshed by an external power source. Improving memory devices may include increasing memory cell density, increasing read/write speeds, increasing reliability, increasing data retention, reducing power consumption, or reducing manufacturing costs, among other metrics.

FeRAM may use similar device architectures as volatile memory but may have non-volatile properties due to the use of a ferroelectric capacitor as a storage device. FeRAM devices may thus have improved performance compared to other non-volatile and volatile memory devices. PCM or chalcogenide-material-based memories may be non-volatile and may offer improved read/write speeds and endurance compared to other memory devices. PCM or chalcogenide-material-based memories may also offer increased memory cell density capabilities. For example, three-dimensional memory arrays employing FeRAM, PCM, or chalcogenide-material-based memories may be possible. In some three-dimensional architectures, however, some areas of the memory device may be dedicated to support circuitry and may be exclusive of memory cells. Such areas may increase the physical dimensions of the memory device without increasing the capacity of the memory device.

BRIEF DESCRIPTION OF THE DRAWINGS

The disclosure herein refers to and includes the following figures:

FIG. 22 shows a flowchart illustrating a method that supports active boundary quilt architecture memory in accordance with embodiments of the present disclosure.

DETAILED DESCRIPTION

Figure 1:
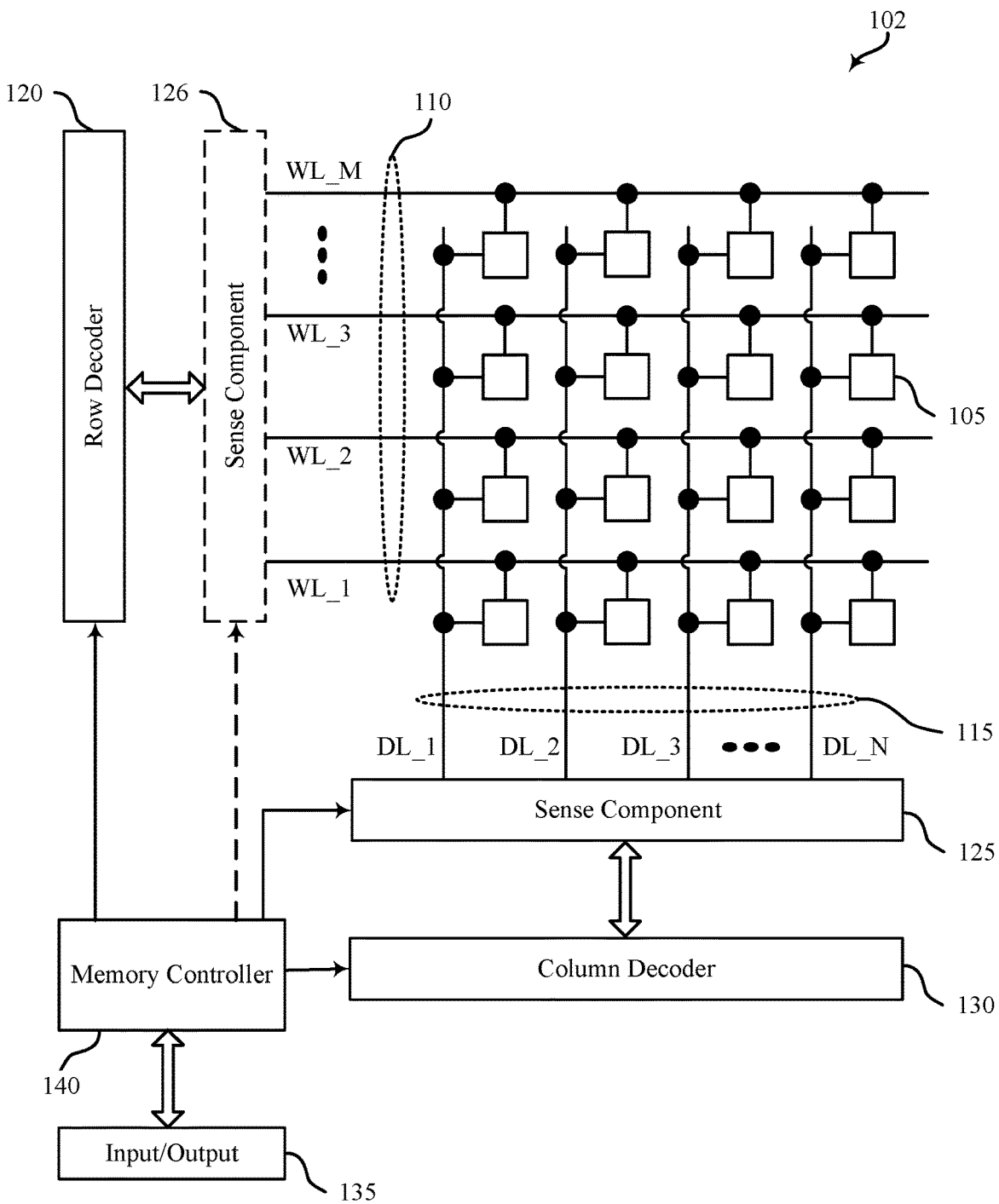
FIG. 1 illustrates an example of a memory device schematic diagram that supports active boundary quilt architecture memory in accordance with embodiments of the present disclosure.

Some memory devices are built using a cross-point architecture having a "quilt" pattern. In some examples, the architecture may be a two-dimensional cross-point architecture. In some examples, the architecture may be a three-dimensional cross-point architecture. The three-dimensional cross-point architecture having the quilt pattern may be accompanied with active boundary portions that enables active memory cells to overlie all or nearly all of the device footprint. The meaning of "quilt" pattern or "quilt" architecture will be further described below. Within the quilt architectures, the memory device may be configured of sections called memory tiles. The memory device may be formed by arranging the memory tiles in an array. Each memory tile may include a similar configuration of components as the other memory tiles. Memory tiles may include a substrate layer that includes support components such as amplifiers and decoders and memory cells positioned above the substrate layer.

Because memory devices are configured to be assembled in an array of memory tiles, memory cells in a memory tile may be accessible using support components (e.g., decoders) positioned in a neighboring memory tile. For instance, the cells of each tile within the quilt architecture may be accessed by decoders underlying adjacent tiles. So a given cell may be accessed from decoders that are outside of the footprint of the tile of which that cell is a party.

To allow memory cells positioned above memory tiles to be accessible, portions of the array near borders of the array of memory tiles may have a different architecture. These portions may be referred to as boundary tiles and may be positioned adjacent to some memory tiles at the borders of the array of memory tiles. As used herein, a border may refer to a reference point on the device (e.g., an imaginary line) separating two areas of the memory device. For example, the term border may refer to a line where a particular portion of the memory device terminates. Boundary tiles may be positioned on a first border of the array of memory tiles and positioned on a second border of the array of memory tiles opposite to the first side. Boundary tiles may include support components for accessing memory cells of neighboring memory tiles. For example, boundary tiles may include decoders and amplifiers.

Techniques are described herein that support active boundary quilt architecture memory, which may increase available data as compared to legacy configurations. The boundary tiles with memory cells positioned above them may be referred to as active boundary tiles. As used herein, a portion or cut of a substrate containing a memory array or circuit may be referred to as a die. Boundary tiles may be positioned on two opposing borders of an array of memory tiles. The boundary tiles may include support components to access both memory cells of neighboring memory tiles and memory cells of the boundary tiles. Column lines and column line decoders may be integrated as part of a boundary tile. In addition, access lines, such as row lines may be integrated as part of a boundary tile. By positioning active boundary tiles having memory cells on two opposing borders of an array of memory tiles, the number of accessible memory cells (e.g., available data) in the memory device may be increased.

Features of the disclosure introduced above are further described below in the context of a memory array. Specific examples are then described for memory devices and memory portions that relate to increasing available data in a quilt architecture. These and other features of the disclosure are further illustrated by and described with reference to apparatus diagrams, system diagrams, and flowcharts that relate to increasing available data in a quilt architecture.

FIG. 1 illustrates an example of a memory device 100 that supports active boundary quilt architecture memory in accordance with embodiments of the present disclosure. FIG. 1 is an illustrative schematic representation of various components and features of the memory device 100. As such, it should be appreciated that the components and feature of the memory device 100 are shown to illustrate functional interrelationships, not their actual physical positions within the memory device 100. In the illustrative example of FIG. 1, the memory device 100 includes a two-dimensional memory array 102. Memory device 100 may also be referred to as an electronic memory apparatus. Memory device 100 includes memory cells 105 that are programmable to store different states. FIG. 1 also shows an alternative schematic option of arranging sense component 126 (in a dashed box). An ordinary person skilled in the art would appreciate that sense component may be associated either with column decoder or row decoder without losing its functional purposes.

Each memory cell 105 may be programmable to store two states, denoted as a logic 0 and a logic 1. In some cases, memory cell 105 is configured to store more than two logic states. A memory cell 105 may include a capacitor or other memory storage element to store a charge representative of the programmable states; for example, a charged and uncharged capacitor may represent two logic states, respectively, or a chalcogenide material may represent different states depending on its crystalline structure or other properties, for example.

Figure 5:
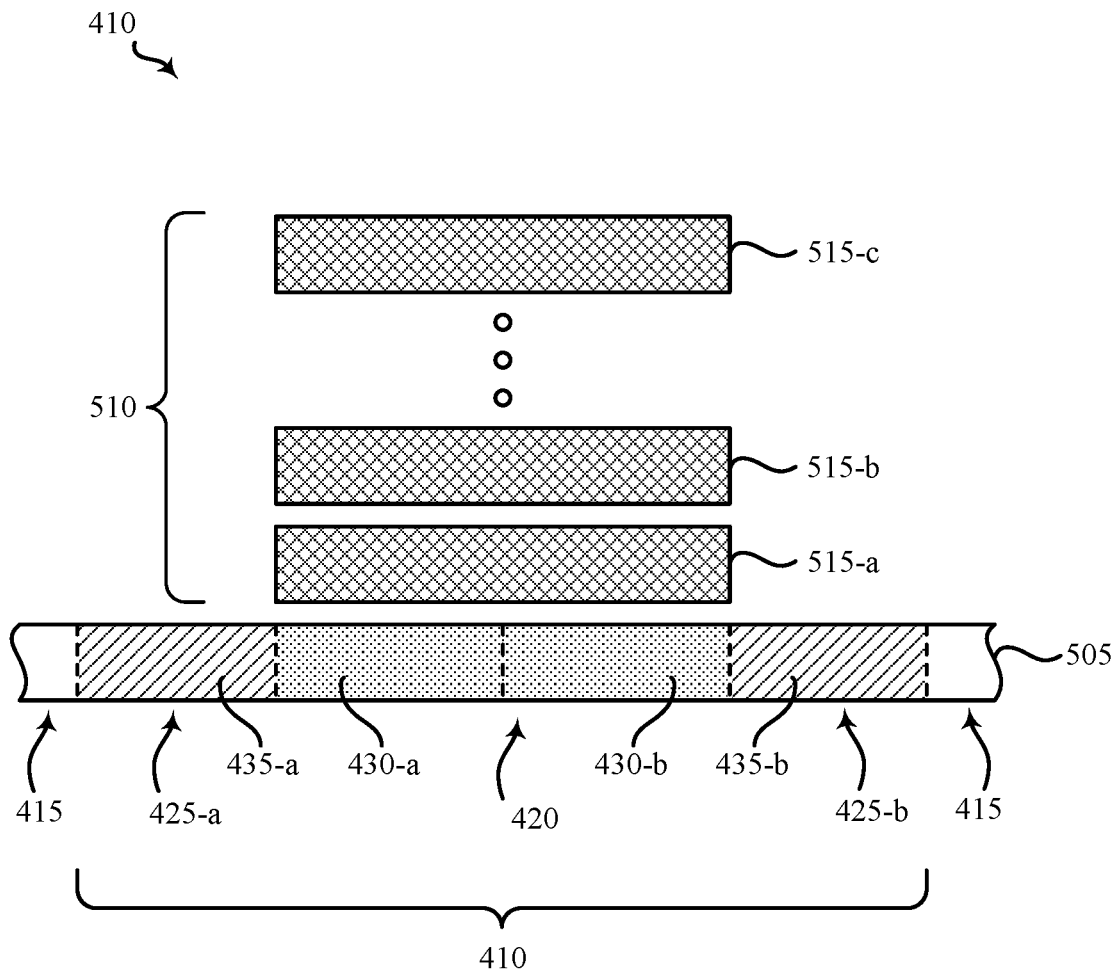
FIG. 5 illustrates an example of a cross-section view of the memory device of FIG. 4 along the line 5-5.
Figure 10:
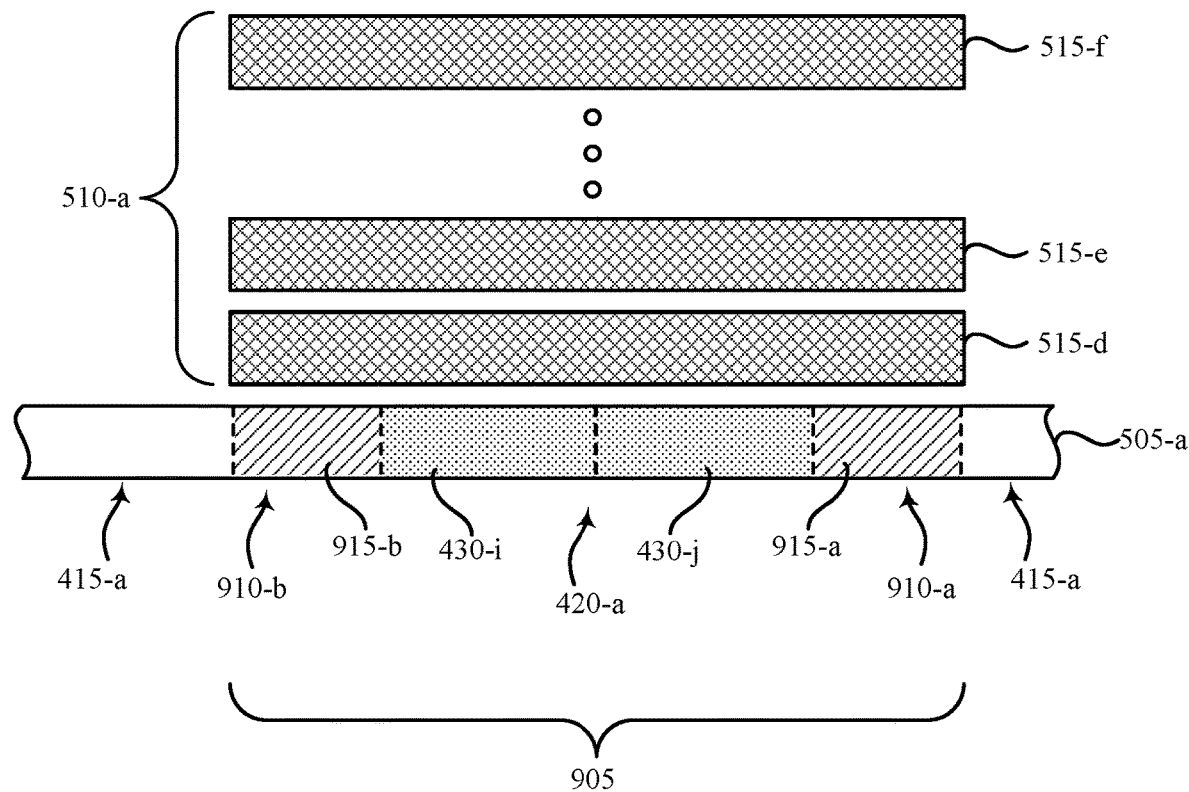
FIG. 10 illustrates an example of a cross-section view of the memory device of FIG. 9 along the line 10-10.

The memory device 100 may be arranged using a quilt architecture. In a quilt architecture, tiles with similar configurations of components are arranged in an array. Memory devices built in such a manner may be expanded or contracted by adding or reducing tiles. The tiles may be building blocks for the memory device 100. Supporting circuitry for the memory device (not shown) may be positioned beneath the arrays of memory cells in a tile as illustrated in FIG. 5 and FIG. 10. As used herein a quilt architecture may refer to a memory array comprising a plurality of memory tiles. For example, a memory having a quilt architecture may comprise a repeating pattern of memory tiles.

Figure 8:
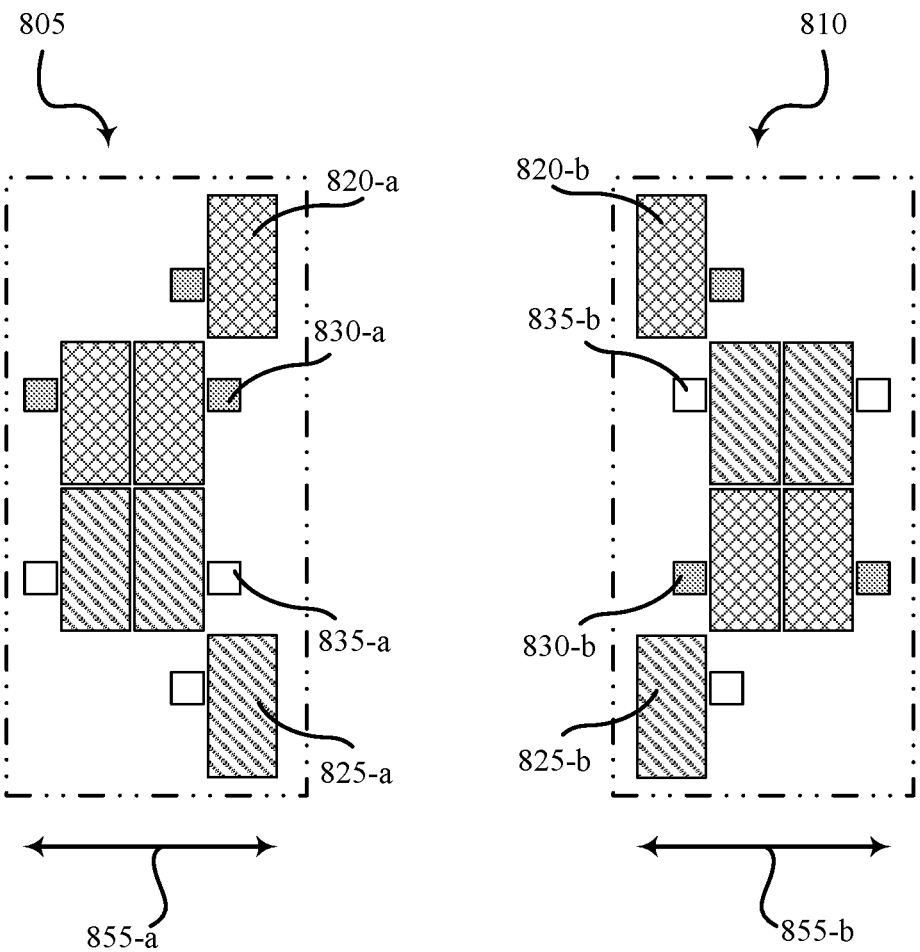
FIG. 8 illustrates examples of boundary tile configurations that supports active boundary quilt architecture memory in accordance with embodiments of the present disclosure.
Figure 12:
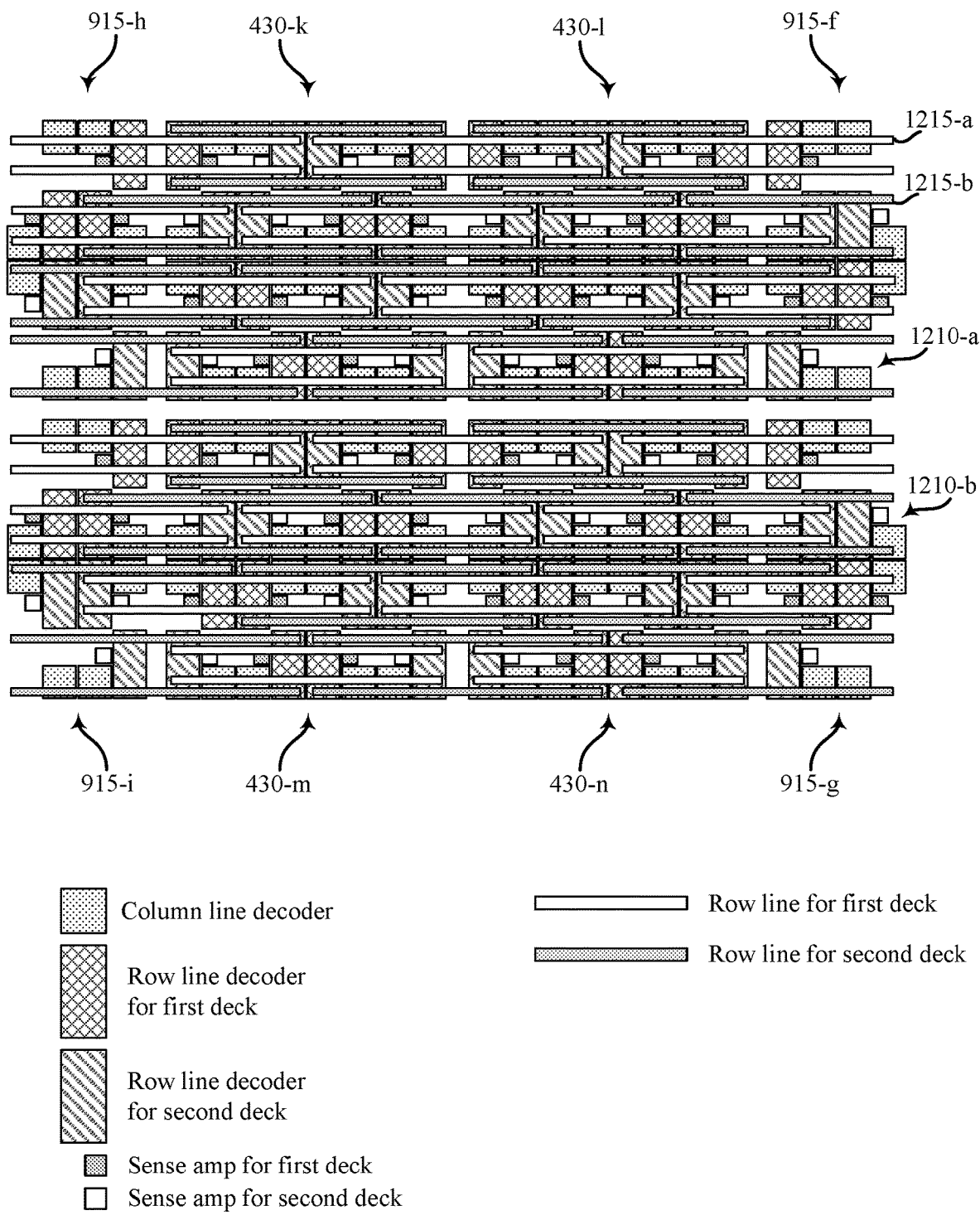
FIGS. 12 through 14 illustrate examples of a memory portion of a memory device that supports active boundary quilt architecture memory in accordance with embodiments of the present disclosure.

In some examples of quilt architecture, some memory cells positioned above supporting circuitry in a tile (not shown) may be accessed using support circuitry positioned in a neighboring tile as illustrated in FIG. 8 and FIG. 12. Consequently, at the borders of the arrays of memory cells, some memory cells may not be accessible. To address these inaccessibility issues, boundary tiles may be positioned beyond the borders of the array of memory cells to ensure all memory cells of the tiles are accessible. In some examples, memory cells may be positioned above the boundary tiles.

Operations such as reading and writing, which may be referred to as access operations, may be performed on memory cells 105 by activating or selecting the appropriate combination of common conductive lines, such as, for example, word line 110 and digit line 115. Word lines 110 may also be referred to as access lines, sense line, or row lines. Digit lines 115 may also be referred to as access lines, bit lines or column lines. References to word lines and bit lines, or their analogues, are interchangeable without loss of understanding or operation. Word lines 110 and bit lines 115 may be perpendicular (or nearly perpendicular) to one another to create an array. Depending on the type of memory cell (e.g., FeRAM, RRAM, etc.), other access lines may be present (not shown), such as plate lines, for example. It should be appreciated that the exact operation of the memory device may be altered based on the type of memory cell and/or the specific access lines used in the memory device.

Activating or selecting a word line 110 or a digit line 115 may include applying a voltage to the respective line. Word lines 110 and digit lines 115 are made of conductive materials. For example, word lines 110 and digit lines 115 may be made of metals (such as copper, aluminum, gold, tungsten, etc.), metal alloys, other conductive materials, or the like. By activating one word line 110 and one digit line 115 (e.g., applying a voltage to the word line 110 or digit line 115), a single memory cell 105 may be accessed at their intersection. Accessing the memory cell 105 may include reading or writing the memory cell 105.

In some architectures, the logic storage element of a cell, e.g., a capacitor, may be electrically isolated from the digit line by a selector device. The word line 110 may be connected to and may control the selector device. For example, the selector device may be a transistor and the word line 110 may be connected to the gate of the transistor. Also, depending on the memory cell (e.g., FeRAM, RRAM, etc.), other access lines, e.g., plate lines (not shown) may be involved in accessing the storage element of a cell. Activating the word line 110 results in an electrical connection or closed circuit between the capacitor of a memory cell 105 and its corresponding digit line 115. The digit line may then be accessed to either read or write the memory cell 105.

Accessing memory cells 105 may be controlled through a row decoder 120 and a column decoder 130. Row decoder 120, sense component 125, and column decoder 130 may be configured under memory cells 105. As discussed below, these components may occupy portions of a substrate layer underlying the array. In some examples, a row decoder 120 receives a row address from the memory controller 140 and activates the appropriate word line 110 based on the received row address; the appropriate word line 110 may be the word line 110 associated with the deck that includes a target memory cell 105, as discussed below. Similarly, a column decoder 130 receives a column address from the memory controller 140 and activates the appropriate digit line 115. For example, memory device 100 may include multiple word lines 110, labeled WL_1 through WL_M for the illustrative array 102, and multiple digit lines 115, labeled DL_1 through DL N, where M and N depend on the array size. Thus, by activating a word line 110 and a digit line 115, e.g., WL_2 and DL_2, the memory cell 105 at their intersection may be accessed.

Upon accessing, a memory cell 105, may be read, or sensed, by sense component 125 to determine the stored logic state of the memory cell 105. For example, after accessing the memory cell 105, the memory component of memory cell 105 may discharge onto its corresponding digit line 115. The discharging may cause a change in the voltage of the digit line 115, which sense component 125 may compare to a reference voltage (not shown) in order to determine the stored state of the memory cell 105. For example, if digit line 115 has a higher voltage than the reference voltage, then sense component 125 may determine that the stored state in memory cell 105 was a logic 1 and vice versa.

Sense component 125 may include various transistors or amplifiers in order to detect and amplify a difference in the signals, which may be referred to as latching. The detected logic state of memory cell 105 may then be output through column decoder 130 as input/output 135. Sense component 125 may operate at a lower voltage than other components of memory device 100. For example, sense component 125 may be or include a low voltage latch.

A memory cell 105 may be set, or written, by activating the relevant word line 110 and digit line 115. As discussed above, activating a word line 110 electrically connects the corresponding row of memory cells 105 to their respective digit lines 115. By controlling the relevant digit line 115 while the word line 110 is activated, a memory cell 105 may be written—i.e., a logic value may be stored in the memory cell 105. Column decoder 130 may accept data, for example input/output 135, to be written to the memory cells 105. A memory cell 105 may be written by applying a voltage or by flowing a current across the memory storage element. This process is discussed in more detail below.

The memory controller 140 may control the operation (e.g., read, write, re-write, refresh, etc.) of memory cells 105 through the various components, such as row decoder 120, column decoder 130, and sense component 125. Memory controller 140 may generate row and column address signals in order to activate the desired word line 110 and digit line 115. Memory controller 140 may also generate and control various voltage potentials used during the operation of memory device 100. In general, the amplitude, shape, or duration of an applied voltage discussed herein may be adjusted or varied and may be different for the various operations for operating the memory device 100. Furthermore, one, multiple, or all memory cells 105 within memory device 100 may be accessed simultaneously; for example, multiple or all cells of memory device 100 may be accessed simultaneously during a reset operation in which all memory cells 105, or a group of memory cells 105, are set to a single logic state. It should be appreciated that the exact operation of the memory device may be altered based on the type of memory cell and/or the specific access lines used in the memory device.

Figure 2:
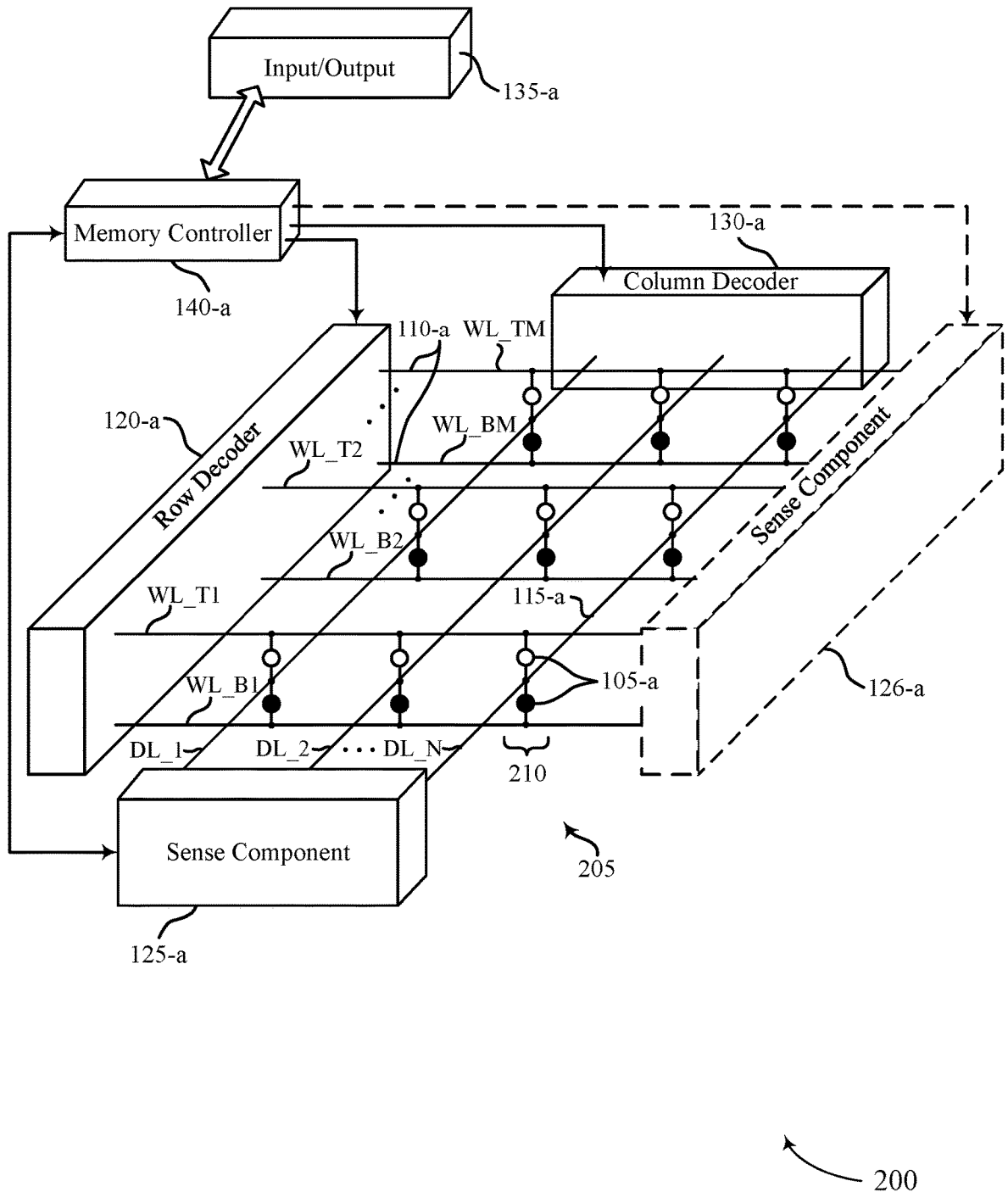
FIG. 2 illustrates an example of a memory device schematic diagram having a three-dimensional array of memory cells that supports active boundary quilt architecture memory in accordance with embodiments of the present disclosure.

FIG. 2 illustrates an example memory device 200 having a three-dimensional array of memory cells that that supports active boundary quilt architecture memory in accordance with embodiments of the present disclosure. FIG. 2 is an illustrative schematic representation of various components and features of the memory device 200. As such, it should be appreciated that the components and feature of the memory device 200 are shown to illustrate functional inter-relationships, not their actual physical positions within the memory device 200. In the illustrative example of FIG. 2, the memory device 200 includes a three-dimensional memory array 205. Memory device 200 may also be referred to as an electronic memory apparatus. The memory device 200 may be an example of the memory device 100 described with reference to FIG. 1. As such, descriptions of components with similar naming and numbering may not be fully described with reference to FIG. 2. Also, FIG. 2 shows an alternative schematic option of arranging sense component 126-*a* (in a dashed box). An ordinary person skilled in the art would appreciate that sense component may be associated either with column decoder or row decoder without losing its functional purposes.

Memory device 200 may include a three-dimensional (3D) memory array 205, where two or more two-dimensional (2D) memory arrays (e.g., memory array 102) are formed on top of one another. In such a configuration, a 2D memory array may be referred to as a deck of memory cells. This may increase the number of memory cells that may be formed on a single die or substrate as compared with 2D arrays, which in turn may reduce production costs or increase the performance of the memory device 200, or both. According to the example depicted in FIG. 2, memory device 200 includes two levels (or decks) of memory cells 105-a and may thus be considered a three-dimensional memory array; however, the number of levels is not limited to two. Each level may be aligned or positioned so that memory cells 105-a may be approximately aligned with one another across each level, forming a memory cell stack 210. In other embodiments (not shown), the memory device 200 may be a single level memory, e.g., a two-dimensional memory array.

As shown in FIG. 2, the two memory cells 105-a in a memory cell stack 210 may share a common conductive line such as a digit line 115-a. That is, a digit line 115-a may be in electronic communication with the bottom electrode of the upper memory cell 105-a and the top electrode of the lower memory cell 105-a. The upper memory cells 105-a may be referred to as a top deck and the lower memory cells 105-a may be referred to as a bottom deck. Other configurations may be possible; for example, a third deck may share a word line 110-a with a lower deck. In general, one memory cell of 105-a may be located at the intersection of two conductive lines, such as a word line 110-a and a digit line 115-a. This intersection may be referred to as a memory cell's address. A target memory cell 105-a may be a memory cell 105-a located at the intersection of an energized word line 110-a and digit line 115-a; that is, a word line 110-a and digit line 115-a may be energized in order to read or write a memory cell 105-a at their intersection. Other memory cells 105 that are in electronic communication with (e.g., connected to) the same word line 110-a or digit line 115-a may be referred to as untargeted memory cells. Also, depending on the memory cell (e.g., FeRAM, RRAM, etc.), other access lines, e.g., plate lines (not shown) may be involved in accessing the storage element of a cell.

Accessing memory cells 105-a may be controlled through a row decoder 120-a and a column decoder 130-a. For example, memory device 200 may include multiple word lines 110-a, labeled WL_T1 through WL_TM for the top deck of the illustrative array 205 and WL_B1 through WL_BM for the bottom deck of the illustrative array 205, and multiple digit lines 115-a, labeled DL_1 through DL N, where M and N depend on the array size. Thus, by activating a word line 110-a and a digit line 115-a, e.g., WL_T2 and DL_2, the memory cell 105-a of the top deck at their intersection may be accessed. By activating, for example, WL_B2 and DL_2, the memory cell 105-a of the bottom deck at their intersection may be accessed. In some examples where other access lines e.g., plate lines, may be present (not shown), a corresponding plate line in collaboration with WL_T2 and DL_2 may need to be activated to access the memory cell 105-a of the top deck. It should be appreciated that the exact operation of the memory device may be altered based on the type of memory cell and/or the specific access lines used in the memory device.

Figure 3:
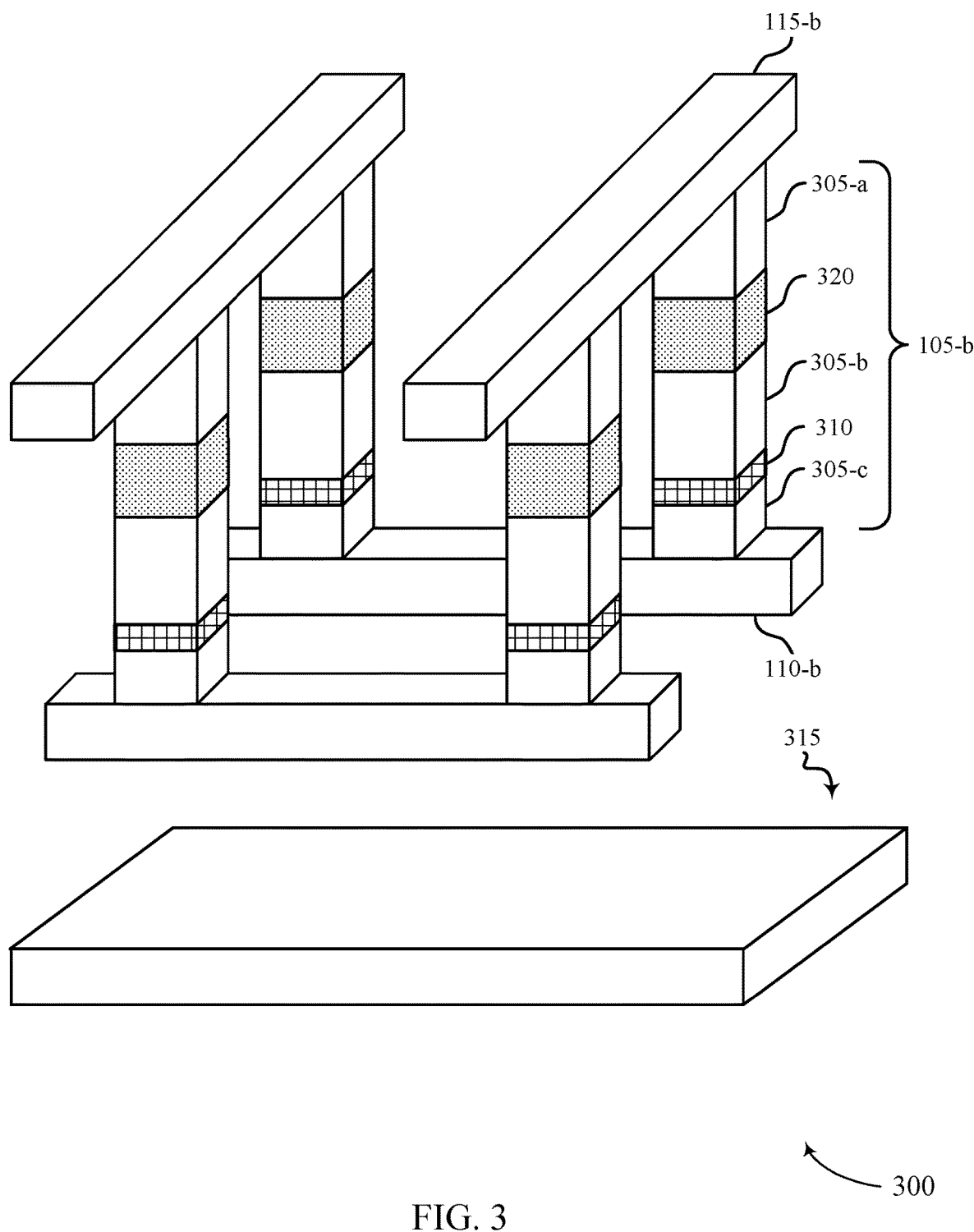
FIG. 3 illustrates an example of a memory array that supports active boundary quilt architecture memory in accordance with embodiments of the present disclosure.

FIG. 3 illustrates an example of memory array 300 that supports active boundary quilt architecture memory in accordance with embodiments of the present disclosure. Memory array 300 may be an example of memory arrays 102 and 205 described with reference to FIGS. 1 and 2. As depicted in FIG. 3, memory array 300 includes multiple materials to construct memory cells 105-b. Each memory cell 105-b is stacked in a vertical direction (e.g., perpendicular to a substrate) to create memory cell stacks. Memory cells 105-b may be examples of a memory cell 105 as described with reference to FIG. 1. Memory array 300 may thus be referred to as a three-dimensional or 3D memory array.

Memory array 300 also includes word lines 110-b and bit lines 115-b, which may be examples of word line 110 and bit line 115, as described with reference to FIG. 1. Illustration of the materials between the word lines 110-b and the bit lines 115-b may represent memory cell 105-a on the lower deck in FIG. 2. Memory array 300 includes electrode 305, logic storage element 310, substrate 315, and selector device 320. In some examples, a single component may act as both a logic storage element and a selector device. Electrode 305-a may be in electronic communication with bit line 115-b and electrode 305-c may be in electronic communication with word line 110-b. Insulating materials depicted as empty spaces may be both electrically and thermally insulating. As described above, in PCM technology, various logic states may be stored by programming the electrical resistance of the logic storage element 310 in memory cells 105-b. In some cases, this includes passing a current through memory cell 105-b, heating the logic storage element 310 in memory cell 105-b, or melting the material of the logic storage element 310 in memory cells 105-b wholly or partially. Other storage mechanism, such as threshold voltage modulation, may be exploited in chalcogenide-based memories. The memory array 300 may be included as part of a quilt architecture such that the memory cells are positioned above a substrate layer that includes the support components.

Memory array 300 may include an array of memory cell stacks, and each memory cell stack may include multiple memory cells 105-b. Memory array 300 may be made by forming a stack of conductive materials, such as word lines 110-b, where each conductive material is separated from an adjacent conductive material by electrically insulating materials in between. The electrically insulating materials may include oxide or nitride materials, such as silicon oxide, silicon nitride, or other electrically insulating materials. These materials may be formed above a substrate 315, such as a silicon wafer, or any other semiconductor or oxide substrate. Subsequently, various process steps may be utilized to form the materials in between the word lines 110-b and bit lines 115-b such that each memory cell 105-b may be coupled to a word line and a bit line.

The selector device 320 may be connected with the logic storage element 310 through electrode 305-b. In some examples, the positioning of the selector device 320 and the logic storage element 310 may be flipped. The stack comprising the selector device 320, the electrode 305-b, and the logic storage element 310 may be connected to a word line 110-b through the electrode 305-c and to a bit line 115-b through the electrode 305-a. The selector device may aid in selecting a particular memory cell 105-b or may help prevent stray currents from flowing through non-selected memory cells 105-b adjacent to a selected memory cell 105-b. The selector device may include an electrically non-linear component (e.g., a non-Ohmic component) such as a metal-insulator-metal (MIM) junction, an Ovonic threshold switch (OTS), or a metal-semiconductor-metal (MSM) switch, among other types of two-terminal selector device such as a diode. In some cases, the selector device includes a chalcogenide film. The selector device may, in some examples, include an alloy of selenium (Se), arsenic (As), and germanium (Ge).

Various techniques may be used to form materials or components on a substrate 315. These may include, for example, chemical vapor deposition (CVD), metal-organic vapor deposition (MOCVD), physical vapor deposition (PVD), sputter deposition, atomic layer deposition (ALD), or molecular beam epitaxy (MBE), among other thin film growth techniques. Material may be removed using a number of techniques, which may include, for example, chemical etching (also referred to as "wet etching"), plasma etching (also referred to as "dry etching"), or chemical-mechanical planarization.

As discussed above, memory cells 105-b of FIG. 3 may include a material with a variable resistance. Variable resistance materials may refer to various material systems, including, for example, metal oxides, chalcogenides, and the like. Chalcogenide materials are materials or alloys that include at least one of the elements sulfur (S), tellurium (Te), or Se. Many chalcogenide alloys may be possible—for example, a germanium-antimony (Sb)-tellurium alloy (Ge—Sb—Te) is a chalcogenide material. Other chalcogenide alloys not expressly recited here may also be employed.

Phase change memory may exploit the large resistance contrast between crystalline and amorphous states in phase change materials, which may be chalcogenide materials. A material in a crystalline state may have atoms arranged in a periodic structure, which may result in a relatively low electrical resistance. By contrast, material in an amorphous state with no or relatively little periodic atomic structure may have a relatively high electrical resistance. The difference in resistance values between amorphous and crystalline states of a material may be significant; for example, a material in an amorphous state may have a resistance one or more orders of magnitude greater than the resistance of the material in its crystalline state. In some cases, the material may be partially amorphous and partially crystalline, and the resistance may be of some value between the resistances of the material in a wholly crystalline or wholly amorphous state. So a material may be used for other than binary logic applications—i.e., the number of possible states stored in a material may be more than two.

To set a low-resistance state, a memory cell 105-b may be heated by passing a current through the memory cell. Heating caused by electrical current flowing through a material that has a finite resistance may be referred to as Joule or Ohmic heating. Joule heating may thus be related to the electrical resistance of the electrodes or the phase change material. Heating the phase change material to an elevated temperature (but below its melting temperature) may result in the phase change material crystallizing and forming the low-resistance state. In some cases, a memory cell 105-b may be heated by means other than Joule heating, for example, by using a laser. To set a high-resistance state, the phase change material may be heated above its melting temperature, for example, by Joule heating. The amorphous structure of the molten material may be quenched, or locked in, by abruptly removing the applied current to quickly cool the phase change material.

The various components, including memory cells 105-b, access lines (e.g., word lines 110-b and bit lines 115-b) may be configured over substrate 315 to efficiently use the area of a die that includes the components. As described below, each component of the memory array may overlie decoders or other circuitry built in the substrate layer to minimize the areas of substrate 315 outside the footprint of the memory array.

Figure 4:
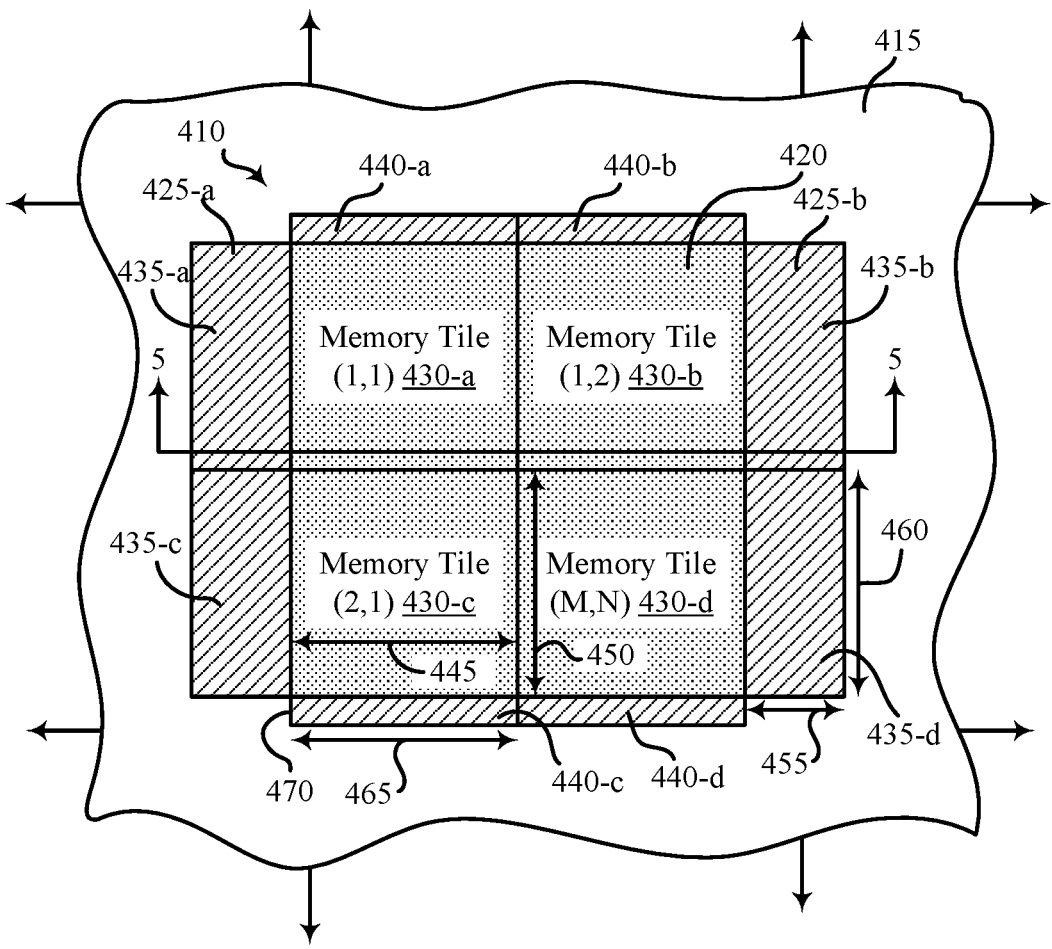
FIG. 4 illustrates an example of a memory device that supports active boundary quilt architecture memory in accordance with embodiments of the present disclosure.

FIG. 4 illustrates an example of a memory device 400 that supports active boundary quilt architecture memory in accordance with embodiments of the present disclosure. As discussed above, the term quilt architecture may refer to a memory device formed of a plurality of memory tiles or memory sections having a common configuration of components. The memory tiles may be arranged in a repeating pattern. The memory device 400 may be an example of the memory device 100, 200 described with reference to FIGS. 1 and 2.

The memory device 400 may include a memory portion 410 and a control circuit portion 415. The memory portion 410 of the memory device 400 may include an array of memory cells and supporting circuitry for the array of memory cells, for example, decoders and sense amplifiers. In some instances, the memory portion 410 may refer to an area of the memory device 400 that includes decoders. The control circuit portion 415 may include other components related to the memory device 400. For example, the control circuit portion 415 may include a memory controller 140 or an input/output 135 system described with reference to FIGS. 1 and 2. In some instances, the control circuit portion 415 may refer to an area of the memory device 400 that may not include some types of decoders or may be exclusive of certain type of decoders. For example, the control circuit portion 415 may be exclusive of row decoders, column decoders, sense amplifiers, or combinations thereof. In some examples, the control circuit portion 415 may include other types of decoders, for example, plate line decoders.

The memory portion 410 may include a core portion 420 and boundary portions 425. The memory portion 410 may include a substrate layer and memory cells positioned above the substrate layer. The core portion 420 may refer to an array of the memory device 400 formed using a plurality of memory tiles 430. In some examples, the core portion 420 may correspond to an area of the memory device 400 that includes an array of memory cells (e.g., array of memory cells 510).

The memory tiles 430 may be referred to as memory sections having common components. Each memory tile 430 in the core portion 420 may have an identical configuration of components. In this manner, the memory tiles 430 may be used as building blocks to assemble the memory device 400. The size of a core portion 420 (and by extension the memory portion 410 and the memory device 400 as a whole) may be flexible using memory tiles 430. A core portion 420 may be enlarged during design or manufacturing by adding additional memory tiles 430. A size of the core portion 420 may be reduced during design or manufacturing by removing memory tiles 430.

The memory tiles 430 may be configured to couple to neighboring memory tiles to form the core portion 420. In some examples, support circuitry (e.g., decoders and amplifiers) positioned in neighboring memory tiles 430 may be configured to access memory cells positioned above the memory tile 430. For example, circuitry in memory tile 430-b may be used to access memory cells positioned above memory tile 430-a. In this manner, a memory tile 430 may not be configured to be fully operational as a stand-alone unit. Rather, a memory tile 430 may rely on the support circuitry of neighboring tiles to provide full functionality to the memory tile 430. For example, support circuitry in neighboring tiles may be used to access memory cells positioned above the memory tile.

At the borders of the core portion 420, a memory tile 430 may not have a neighboring tile to provide support circuitry for accessing memory cells positioned above the memory tile 430. To ensure functionality of all memory cells associated with a memory tile 430 on the edge of the core portion 420, boundary portions 425 may be disposed around the core portion 420. The boundary portions 425 may include a plurality of first kind of boundary tiles 435 and a plurality of second kind of boundary tiles 440. The first kind of boundary tiles 435 may be positioned at core portion 420 borders crossed by row access lines or word lines. The second kind of boundary tiles 440 may be positioned at core portion 420 borders crossed by column access lines or digit lines.

The various tiles in the memory device 400 may have certain relative dimensions. A memory tile 430 may have a first dimension 445 extending in a first direction and a second dimension 450 extending in a second direction orthogonal to the first direction. In some examples, the first dimension 445 may be equal to the second dimension 450. In some examples, the first dimension 445 may be different from the second dimension 450. In some examples, the first dimension 445 may be equal to eight units and the second dimension 450 may be equal to eight units. A unit may be associated with the size of the decoders in the memory tile.

The first kind of boundary tile 435 may have a first dimension 455 extending in the first direction and a second dimension 460 extending in the second direction. The second dimension 460 may be equal to the second dimension 450. The first dimension 455 may be different than the first dimension 445. In some examples, the first dimension 455 of the first kind of boundary tile 435 is three-eighths the size of the first dimension 445 of the memory tile 430. In other examples, the first dimension 455 may be any relative size compared to the first dimension 445. The dimensions 455, 460 of the first kind of boundary tile 435 may be determined based at least in part on the support circuitry (e.g., decoders and amplifiers) used to access memory cells positioned above neighboring memory tiles 430. In some examples, the first dimension 455 may be equal to the second dimension 460. In some examples, the first dimension 455 may be different from the second dimension 460.

The second kind of boundary tile 440 may have a first dimension 465 extending in the first direction and a second dimension 470 extending in the second direction. The first dimension 465 may be equal to the first dimension 445. The second dimension 470 may be different than the second dimension 450 and the second dimension 460. In some examples, the second dimension 470 of the second boundary tile 440 is one-eighths the size of the second dimension 450 of the memory tile 430. In other examples, the second dimension 470 may be any relative size compared to the second dimension 450. The dimensions 465, 470 of the second boundary tile 440 may be determined based at least in part on the support circuitry used to access memory cells positioned above neighboring memory tiles 430. For example, the second boundary tile 440 may include column decoders coupled to column lines to assist in accessing memory cells positioned above neighboring memory tiles 430. In some examples, the first dimension 465 may be equal to the second dimension 470. In some examples, the first dimension 465 may be different from the second dimension 470.

FIG. 5 illustrates an example of a cross-section view 500 of the memory device 400 of FIG. 4 along the line 5-5. The cross-section view 500 shows the various layers and decks of memory cells that may be included in the memory device 400. The memory device 400 may include a substrate layer 505 and decks 515 of memory cells positioned above the substrate layer 505. In some examples, the substrate layer 505 may be referred to as a peripheral area.

The substrate layer 505 may include the portion of the memory device 400 that includes support circuitry such as decoders and amplifiers. The substrate layer 505 may include portions of the control circuit portion 415, portions of the core portion 420 (e.g., the support circuitry but not the memory cells), and portions of the boundary portion 425. In some examples, the substrate layer 505 is positioned below the array of memory cells 510. The substrate layer of the memory portion 410 may be referred to as complementary metal-oxide-semiconductor (CMOS) under array (CuA). The core portion 420 and the boundary portion 425 may be referred to as CuA.

The array of memory cells 510 may be an example of the memory cells 105 described with reference to FIGS. 1 and 2. The array of memory cells 510 may include a plurality of decks 515 of memory cells. The decks 515 of memory cells may each be a two-dimensional array of memory cells. The decks 515 of memory cells may be an example of the decks of memory cells described with reference to FIG. 2. The array of memory cells 510 may be positioned over the core portion 420 of the substrate layer 505. In the illustrative example, the array of memory cells is not positioned over the boundary portion 425 or the control circuit portion 415 of the substrate layer 505 such that the decks 515 do not overlap the portions 415 and 425. The memory device 400 may include any number of decks 515 of memory cells. In some examples all of the memory cells positioned above the core portion 420 are accessible using support components positioned in the core portion 420 and the boundary portion 425.

Figure 6:
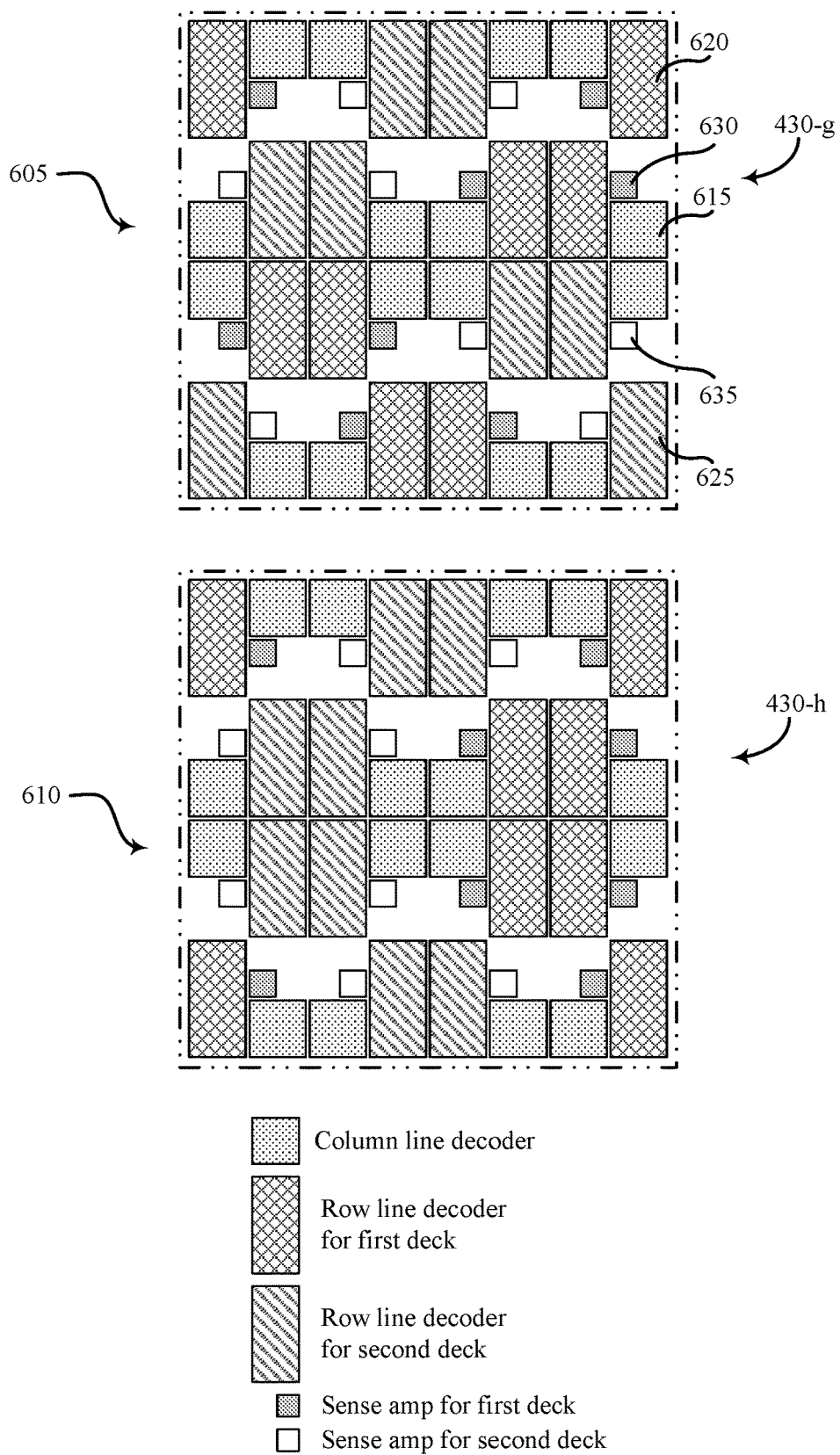
FIG. 6 illustrates an example of memory tile configurations that supports active boundary quilt architecture memory in accordance with embodiments of the present disclosure.

FIG. 6 illustrates an example of memory tile configurations 600 that supports active boundary quilt architecture memory in accordance with embodiments of the present disclosure. FIG. 6 illustrates only a portion of components in the substrate layer of a memory tile for clarity purposes. The memory tile configurations 600 may include a first configuration 605 and a second configuration 610. The first configuration 605 and the second configuration 610 may be examples of memory tiles 430 described with reference to FIGS. 4 and 5. A core portion 420 of a memory device 400 may be formed as a repeating pattern of one of the configurations 605, 610.

The first configuration 605 and the second configuration 610 include similar components but different arrangements of components. Each configuration 605, 610 includes column line decoders 615, row line decoders 620 for a first deck 515-1 of memory cells, row line decoders 625 for a second deck 515-2 of memory cells, sense amplifiers 630 for the first deck 515-1, and sense amplifiers 635 for the second deck 515-2. In some examples, the configuration 605, 610 may include components for any number of memory decks of memory cells. In the memory tiles 430 may include additional circuitry and components not expressly described with regards to the configurations 605, 610.

Figure 13:
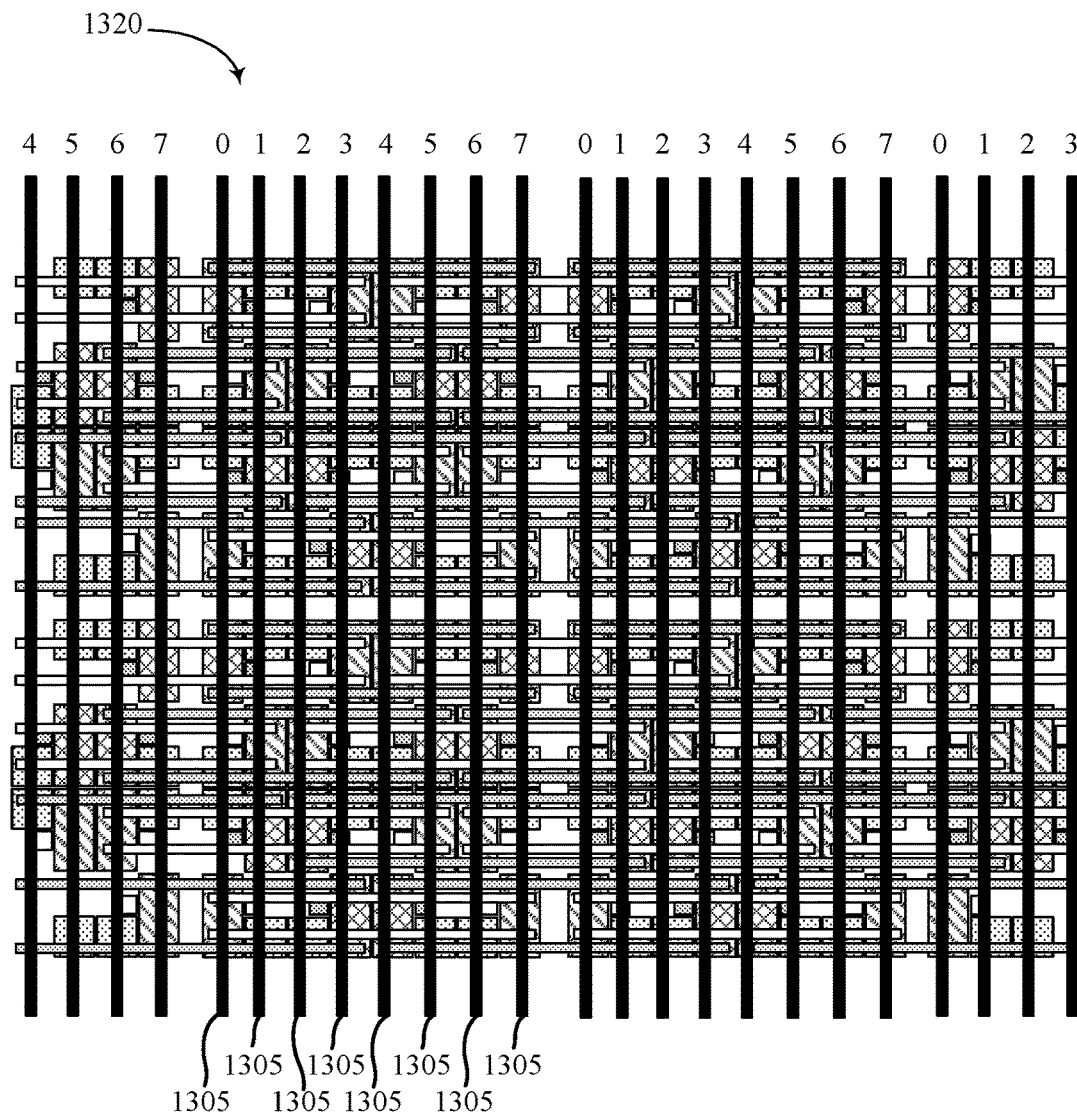
Figure 13:
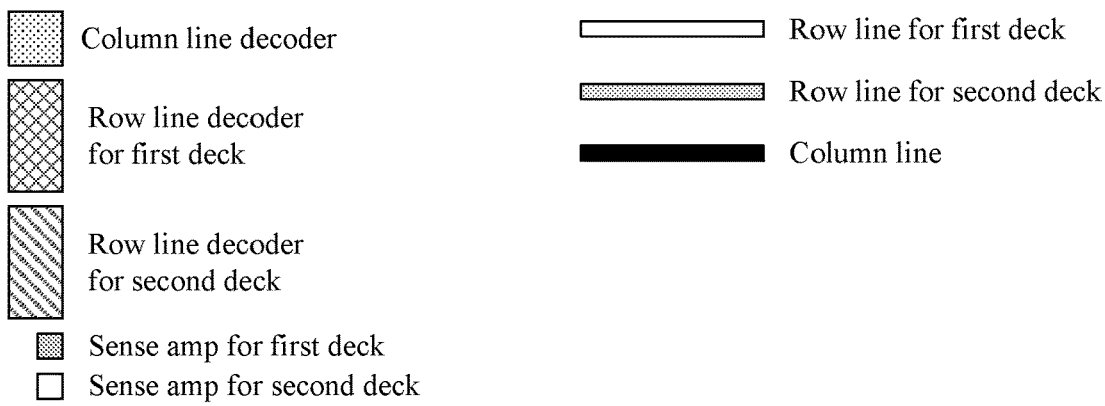

The column line decoder 615 may be coupled to column line (e.g., column lines 1305 in FIG. 13). The column line decoder 615 may be configured to access memory cells in multiple decks 515. A single column line may be configured to access multiple decks 515 of memory cells. The column line decoder 615 may be positioned in a variety of locations in the memory tile 430. The column line decoder 615 may be a number of shapes and sizes. The locations and sizes shown in configurations 605, 610 are for illustrative purposes only and are not limiting. The column line decoder 615 may be an example of the column decoder 130 described with reference to FIG. 1.

Figure 7:
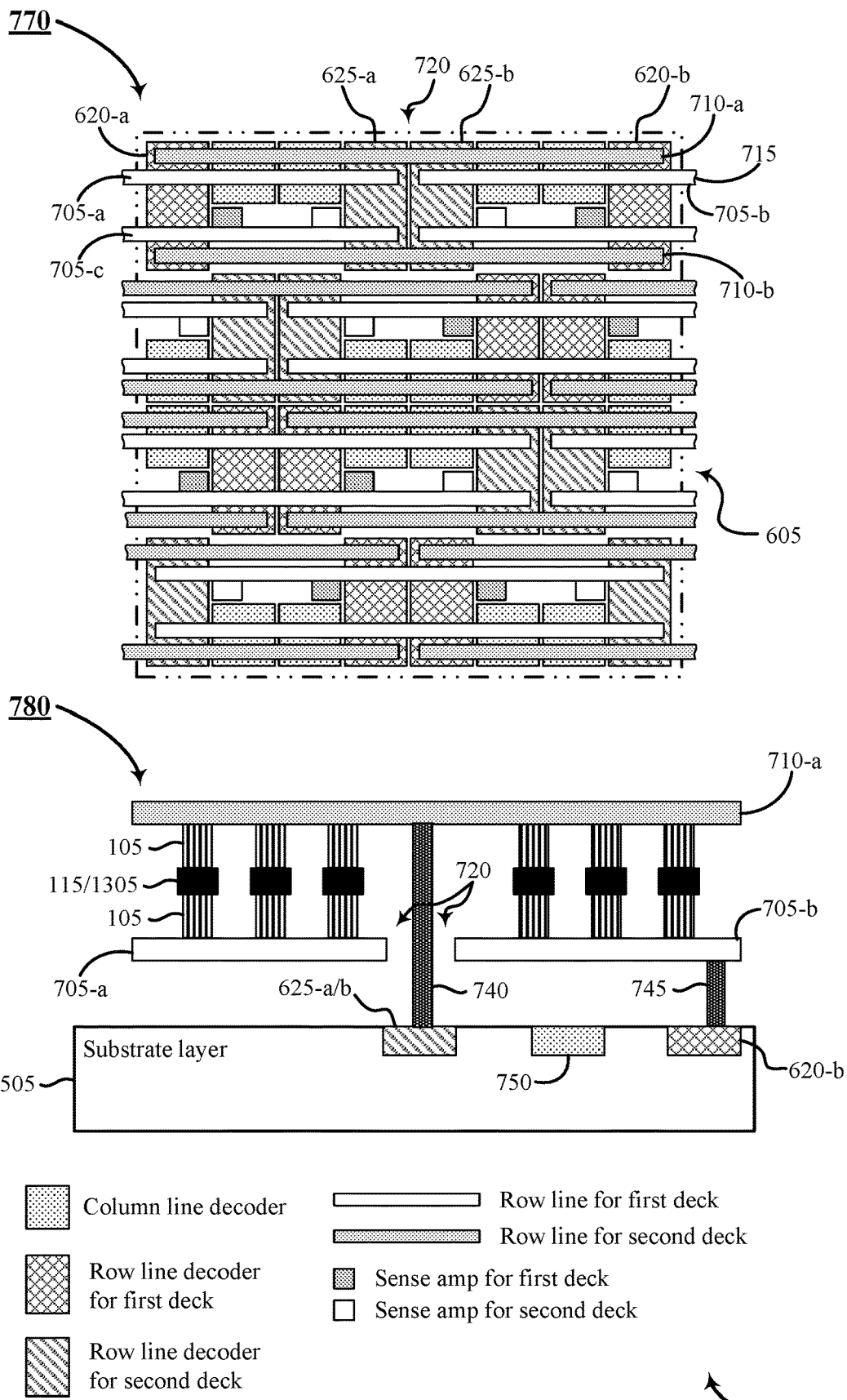
FIG. 7 illustrates an example of a top down view of a memory tile and a schematic cross-section view of the memory tile that supports active boundary quilt architecture memory in accordance with embodiments of the present disclosure.

The row line decoder 620 may be coupled to a row line (e.g., row lines 705 in FIG. 7). The row line decoder 620 may be configured to access memory cells in a single deck 515 (e.g., accessing memory cells in deck 515-1). A single row line may be associated with a single deck 515 of memory cells. The row line decoder 620 may be positioned in a variety of locations in the memory tile 430. The row line decoder 620 may be a number of shapes and sizes. The locations and sizes shown in configurations 605, 610 are for illustrative purposes only and are not limiting. The row line decoder 620 may be an example of the row decoder 120 described with reference to FIG. 1.

The row line decoder 625 may be coupled to a row line (e.g., row lines 710 in FIG. 7). The row line decoder 625 may be configured to access memory cells in a single deck 515 (e.g., accessing memory cells in deck 515-2). A single row line may be associated with a single deck 515 of memory cells. The row line decoder 625 may be positioned in a variety of locations in the memory tile 430. The row line decoder 625 may be a number of shapes and sizes. The locations and sizes shown in configurations 605, 610 are for illustrative purposes only and are not limiting. The row line decoder 625 may an example of the row decoder 120 described with reference to FIG. 1. The row line decoder 625 may be an example of the row line decoder 620 described above.

The sense amplifier 630 may be coupled to a row line (e.g., row lines 705 of FIG. 7). The sense amplifier 630 may be configured to amplify a signal on a row line during an access operation. The sense amplifier 630 may be associated with a single deck 515 of memory cells (e.g., deck 515-1). The sense amplifier 630 may be positioned in a variety of locations in the memory tile 430. The sense amplifier 630 may be a number of shapes and sizes. The locations and sizes shown in configurations 605, 610 are for illustrative purposes only and are not limiting. The sense amplifier 630 may be an example of at least a component of the sense component 125 or 126 described with reference to FIG. 1.

The sense amplifier 635 may be coupled to a row line (e.g., row lines 710 of FIG. 7). The sense amplifier 635 may be configured to amplify a signal on a row line during an access operation. The sense amplifier 635 may be associated with a single deck 515 of memory cells (e.g., deck 515-2). The sense amplifier 635 may be positioned in a variety of locations in the memory tile 430. The sense amplifier 635 may be a number of shapes and sizes. The locations and sizes shown in configurations 605, 610 are for illustrative purposes only and are not limiting. The sense amplifier 635 may be an example of at least a component of the sense component 125 or 126 described with reference to FIG. 1. The sense amplifier 635 may be an example of the sense amplifier 630 described above. In some examples, sense amplifiers 630 and 635 may be coupled to column lines rather than row lines. An ordinary person skilled in the art would appreciate that sense amplifiers may be coupled to either column lines or row lines without losing its functional purposes.

The configuration 605 of a memory tile 430 may be arranged such that if memory tiles 430 having the configuration 605 are placed in a repeating pattern an array of memory cells and support circuitry may be formed. The support circuitry (e.g., decoders and amplifiers) may be arranged such that when memory tiles 430 are positioned next to each other, a continuous pattern of components are formed. For example, if a memory tile 430-h having the configuration 605 is placed next to a memory tile 430-g having a configuration 605 (e.g., memory tiles 430 of FIG. 4), a repeating pattern of decoders 620, decoders 615, decoders 625, decoders 615, etc. may be formed in a first direction. A similar pattern of decoders may be formed by configuration 605 in a second direction orthogonal to the first direction.

The configuration 610 of a memory tile 430 may be arranged such that if memory tiles 430 having the configuration 610 are placed in a repeating pattern an array of memory cells and support circuitry may be formed. Similar to configuration 605, if a memory tile 430-h having the configuration 610 is placed next to a memory tile 430-g having a configuration 610 (e.g., memory tiles 430 of FIG. 4), a repeating pattern of decoders 620, decoders 615, decoders 625, decoders 615, etc. may be formed in a first direction. However, a different pattern of decoders may be formed by the configuration 610 in a second direction orthogonal to the first direction.

In some instances, the core portion 420 may include a multiple configurations 600 of memory tiles 430. A set of distinct configurations may be configured to cooperate with one another. For example, a core portion 420 may include two distinct configurations of memory tiles 430 arranged in an alternating pattern. In other examples, patterns that use three or more configurations may be formed using memory tiles 430.

FIG. 7 illustrates an example of a memory tile 700 that supports active boundary quilt architecture memory in accordance with embodiments of the present disclosure. FIG. 7 depicts both a top-down view 770 and a cross-section view 780 of the memory tile 700. The top-down view 770 illustrates only components in the substrate layer and row lines for clarity. For example, portions of the memory tile may be omitted for clarity. The row lines are shown offset in a two-dimensional arrangement in 770 for clarity purposes only. The cross-section view illustrates only components in the substrate layer and row lines for clarity in addition to a few two-deck memory cells and bit lines associated with them. In another example, row lines associated with different decks may be positioned at different heights in the memory device as depicted in the cross-section view 780. As such, in some examples, row lines may overlap or may stacked on top of another as depicted in the cross-section view 780. In some examples, the memory tile 700 may be an example of the memory tile 430 described with reference to FIGS. 4-6. The memory tile 700 may be arranged in a manner similar to the configuration 605 described with reference to FIG. 6. The memory tile 700 may include a row line 705 and a row line 710 overlaid the support circuitry (e.g., decoders and amplifiers). The row lines 705, 710 may be an example of word lines 110 described with reference to FIGS. 1 and 2. References to word lines and bit lines, or their analogues are interchangeable without loss of understanding or operation.

The row lines 705, 710 may be coupled to memory cells in the memory array. A particular row line may be dedicated to a particular deck 515 of memory cells. For example, row line 705 may be associated with a first deck 515-a and row line 710 may be associated with a second deck 515-b. The row lines 705, 710 may each have a common length. In some examples, row lines associated with a higher deck of memory cells may be longer than the common length. For example, a row line 710-a may extend a fixed distance between two unassociated row decoders. Row line 710-a is associated with the second deck of memory cells. Row line 710-a may also be associated with row line decoders 625-a and 625-*b* such that memory cells of the second deck are operatively coupled to the decoders 625-*a*, 625-*b* via the row line 710-*a*. Row line 710-*a* extends from a row line decoder 620-*a* adjacent to the row line decoder 625-*a* in a first direction to a row line decoder 620-*b* adjacent to the row line decoder 625-*b* in the first direction. It should be appreciated that the row line decoders 620-*a*, 620-*b* are associated with a different deck of memory cells than the row line 710-*a*. Row line decoder 625-*a* or row line decoder 625-*b* or both are associated with the row line 710-*a*. In some instances, the row line 710-*a* terminates at or near a division between two adjacent row decoders associated with a different deck (e.g., row decoders 620-*a* and 620-*b*). This may occur because construction of circuitry associated with the row decoders may prevent the row line 710-*a* from extending further. In some instances, row line 705-*a* or row line 705-*b* may also terminate at or near a division between two adjacent row decoders associated with a different deck (e.g., row decoders 625-*a* and 625-*b*). For example, area 720 between row line decoders 625-*a* and 625-*b* may prevent row lines 705-*a* and 705-*b* from extending further. In some examples, the row lines and the column lines associated with an upper deck of memory cells may be longer than the row lines and column lines associated with a lower deck of memory cells. In some examples, the area 720 between row line decoders may be used for connections of row lines of higher decks. In some examples, the area 720 may be impassable to some row lines (e.g., row lines 705) because a wall of vias coupled to row lines of other decks (e.g., row lines 710) are occupying this space as depicted in the cross-section view 780.

Row lines 705, 710 may span boundaries between memory tiles 700. For example, end 715 may show that row line 705-*b* extends beyond the specific memory tile 700 represented in FIG. 7. In some examples, the row lines 705, 710 may be formed by overlaying the row lines over the substrate layer 505. In some examples, there may be additional types of row lines based at least in part on the number of distinct decks 515 of memory cells that are part of the memory device 400. The row lines 705, 710 may be positioned in a variety of locations in the memory tile 700. The row lines 705, 710 may be any number of shapes and sizes. The locations and sizes shown in FIG. 7 are for illustrative purposes only and are not limiting. In some instances, a subset of row lines may have a length that is less than the common length. For example, some row lines may be terminated early because the row lines reach an edge of the memory portion 410 of the memory device 400. In some examples, row lines 705, 710 may be positioned over boundary tiles 435.

The cross-section view 780 illustrates that row lines 705 may be positioned at a different distance from the substrate layer 505 than row lines 710. In some examples, row lines 710 positioned over row lines 705. In some examples, the row lines 710 are positioned directly over top of row lines 705. In some examples, the row lines 710 may be offset from the row lines 705. Contacts 740, 745 may extend from the substrate layer 505 to their respective decks of memory cells. For example, contact 740 may couple row line decoders for the second deck (e.g., row line decoders 625) to a row line for the second deck (e.g., row line 710). In other examples, contact 745 may couple row line decoder for the first deck (e.g., row line decoders 620) to a row line for the first deck (e.g., row line 705). In some examples, the contacts 740, 745 may be vias. In some cases, the contacts 740 may configured as stacked contacts. In some examples, a plurality of the contacts 740 may form a wall that does not permit the row lines 705 to extend through. In some examples, the contacts 740, 745 may not be considered part of their respective decoders. Regardless of the designation of the contacts 740, 745, it should be appreciated that memory cells may be positioned over or above the decoders 620, 625 and other support circuit component 750 (e.g., column decoders or sense amplifiers).

In some examples, plate lines (now shown) or other access lines may be integrated into the memory tiles 700. For example, a plate line may be configured to bias a memory cell during an access operation. Other decoders may be incorporated into the memory device to utilize the other access lines or plate lines. Plate lines or other access lines may be in electronic communication with a memory controller of the memory device. In some examples, plate lines may be coupled to a plate associated with a capacitor of a memory cell in the memory device.

FIG. 8 illustrates an example of boundary tile configurations 800 that supports active boundary quilt architecture memory in accordance with embodiments of the present disclosure. FIG. 8 illustrates only components in the substrate layer for clarity. The boundary tile configurations 800 may include a first configuration 805 and a second configuration 810. The first configuration 805 may be configured and arranged to be positioned on a first border of the core portion (e.g., the left side of the core portion 420 shown in FIG. 4). For example, the boundary tiles (e.g., boundary tiles 435 of FIG. 4) may be arranged using the first configuration 805. The second configuration 810 may be configured and arranged to be positioned on a second border of the core portion opposite to the first side (e.g., the right side of the core portion 420 shown in FIG. 4). For example, the boundary tiles may be arranged using the second configuration 810. The first configuration 805 and the second configuration 810 may be examples of boundary tiles 435 described with reference to FIGS. 4 and 5. Boundary portions 425 of a memory device 400 depicted in FIG. 4 may be formed as a repeating pattern of the configuration 805, 810. Configurations 805 and 810 may have dimensions 855.

The configurations 805, 810 may correspond to a core portion 420 formed of memory tiles arranged using the configuration 605. In other examples, components of the configurations 805, 810 may be rearranged to correspond to the configuration 610 or any other configurations of memory tiles (e.g., memory tiles 430 of FIG. 4).

The configurations 805, 810 include row line decoders 820, row line decoders 825, sense amplifiers 830, and sense amplifiers 835. These may be examples of row line decoders 620, row line decoders 625, sense amplifiers 630, and sense amplifiers 635, respectively, as described with reference to FIG. 6. In the illustrative example, configurations 805, 810 do not include column line decoders. In the example of FIG. 8, because memory cells may be absent in the boundary tiles, column lines may also not be positioned in the boundary tiles, and, therefore, column line decoders may not be included in the configurations 805, 810.

The boundary tile configurations 800 may include a number of decoders that is less than a number of decoders in a memory tile 430 of the core portion 420. For example, because memory cells are not positioned above the substrate layer of a boundary tiles 435, the boundary tile configurations 800 may not include column decoders. In other examples, the boundary tile configurations 800 may include fewer row decoders 620, 625 and fewer sense amplifiers 630, 635 than are present in a memory tile 430 of the core portion 420. In some examples, the number of decoders in a single boundary tile configuration 800 (e.g., first configuration 805 or second configuration 810) may be less than half of the number of decoders in a memory tile 430 of the core portion 420.

Figure 9:
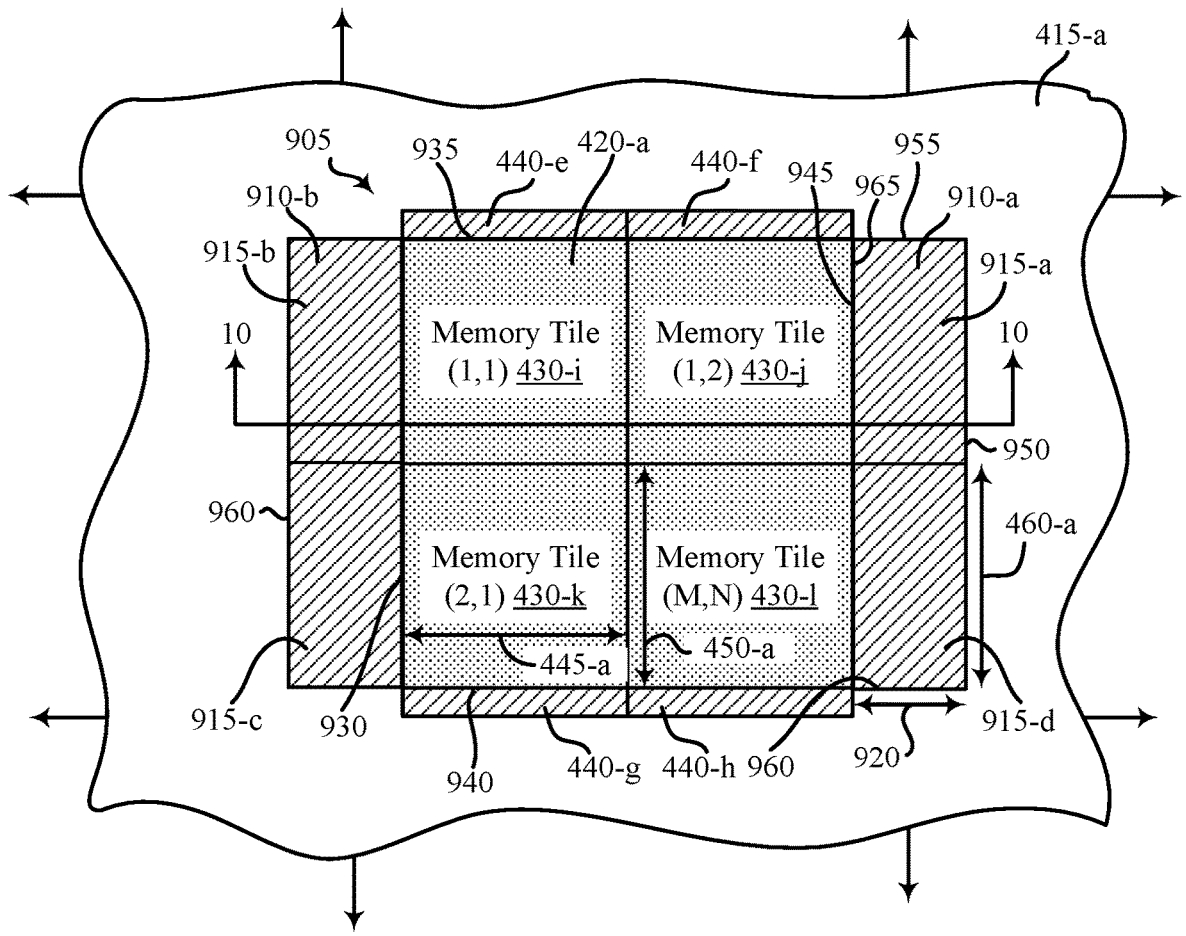
FIG. 9 illustrates an example of a memory device that supports active boundary quilt architecture memory in accordance with embodiments of the present disclosure.

FIG. 9 illustrates an example of a memory device 900 that supports active boundary quilt architecture memory in accordance with embodiments of the present disclosure. The memory device 900 may include a memory portion 905 and a control circuit portion (e.g., control circuit portion 415 of FIG. 4). The memory portion 905 may include a core portion (e.g., core portion 420 of FIG. 4) and boundary portions 910. The boundary portions 910 may be referred to as active boundary portions because the boundary portions include decks of memory cells positioned above the substrate layer. The memory portion 905 of the memory device 900 includes active boundary portions 910 positioned on two borders of the core portion such that row access lines or word lines cross between the core portion and the active boundary portions. In this manner, number of memory cells in the memory device 900 increases while the area of the memory portion 905 may remain the same as the area of the memory portion (e.g., memory portion 410 of the memory device 400 described with reference to FIG. 4). The memory device 900 may be an example of the memory devices 200, 400, or 500 described with reference to FIGS. 2, 4, and 5. The memory portion 905 may be an example of the memory portion 410 described with reference to FIGS. 4 and 5. The boundary portions 910 may be an example of the boundary portions 425 described with reference to FIGS. 4 and 5.

The area of the memory portion 905 of the memory device 900 in FIG. 9 may be the same as the area of memory portion 410 of the memory device 400 in FIG. 4. The active boundary portions 910 of the memory device 900 in FIG. 9 may have different dimensions from the boundary portions 425 of the memory device 400 in FIG. 4. The total area of the active boundary portions 910 may be more than the combined total area of the boundary portions 425. In some examples, the active boundary portions of the memory device 900 may have an area larger than the boundary portions of the memory device 400. However, the total number of memory cells in the memory device 900 may be increased as compared to the total number of memory cells in the memory device 400 due to additional number of memory cells present in the active boundary portions 910 of the memory device 900.

Difference in the areas of the core portion and the active boundary portions 910 may be appreciated based on the dimensions of the respective portions. The core portion may include a number of memory tiles 430. The memory tiles 430 may define a first dimension 445-a and a second dimension 450-a.

The active boundary portions 910 may include a number of active boundary tiles 915. Boundary tiles 915 may be an example of the boundary tiles 435 described with reference to FIGS. 4, 5, and 8. A boundary tile 915 may include a first dimension 920 extending a first direction and a second dimension 460 extending in a second direction orthogonal to the first direction. The first dimension 920 may be different than the first dimension 445. In some examples, the first dimension 920 of the first boundary tile 915-a is approximately one-half the size of the first dimension 445-a of the memory tile 430. In other examples, the first dimension 920 may be any relative size compared to the first dimension 445. The dimensions 920, 460-a of the first boundary tile 915-d may be determined based at least in part on the support circuitry (e.g., decoders and amplifiers) used to access memory cells positioned in neighboring memory tiles 430 and in the boundary tile 915. In some examples, the first dimension 920 may be equal to the second dimension 460-a. In some examples, the first dimension 920 may be different from the second dimension 460-a.

In some examples, the first dimension 920 may be larger than the first dimension 455 depicted in FIG. 4 of the boundary tile 435 depicted in FIG. 4 because the boundary tile 915 may include additional components to access memory cells positioned in the boundary tile 915. In some instances, the first dimension 920 may be larger because of additional column line decoders (e.g., column line decoders 615 described with reference to FIG. 6) present in the boundary tile 915.

The memory portion 905 may define a number of borders. For example, the core portion 420-a may include borders 930, 935, 940, 945. As used herein, a border may refer to a reference or an imaginary line separating two areas of the memory device 900. For example, the term border may refer to a line where a particular portion of the memory device 900 terminates. The first border 930 and the second border 945 may define an intersection of the core portion 420-a with the boundary portions 910. In some examples, the borders 935, 940 may be defined as the line where an array of memory cells terminates.

The boundary portion 910-a may include borders 950, 955, 960, 965. The first border 950, the second border 955, and the third border 960 may define an intersection of the boundary portion 910 with the control circuit portion 415. In some examples, the borders 950, 955, 960 may be defined as the line where an array of memory cells terminates or an array of support circuitry terminates. The fourth border 965 may cooperate with the border 945 to define an intersection of the core portion 420-a and the boundary portion 910-a. In some examples, borders may be defined between memory tiles 430 and/or boundary portions 910.

In some examples, the borders 930, 935, 940, 945, 950, 955, 960, and 965 may be aligned with an edge of a decoder. In some examples, the borders 930, 935, 940, 945, 950, 955, 960, and 965 may extend beyond the edge of a decoder. The intersection of the core portion 420 and the boundary portions 910 or the outer boundaries (e.g., as represented by border 935, 940, 950, and 960) may be less precise in practice than what is depicted in FIG. 9. In some examples, the outer boundaries may be aligned with edges of the array of memory cells. In some examples, the borders may be substantially aligned with the decoders' edge and the array of memory cells may be within a footprint of the decoders. In other examples, the border may be substantially aligned with the edge of the array of memory cells and the decoders may be within a footprint of the array of memory cells.

FIG. 10 illustrates an example of a cross-section view 1000 of the memory device 900 of FIG. 9 along the line 10-10. The cross-section view 1000 shows the various layers and decks that may be included in the memory device 900. The memory device 900 may include a substrate layer 505 and decks 515 of memory cells positioned above the substrate layer 505. The cross-section view 1000 may be an example of the cross-section view 500 described with reference to FIG. 5.

In the memory device 900, the arrays of memory cells 510-a (or the decks 515) are positioned over both the core portion 420-a and the boundary portions 910. In this manner, the arrays of memory cells 510-a may be positioned over the entire memory portion 905 of the memory device 900.

Some memory cells positioned above support circuitry in a memory tile may be accessed using support circuitry in a neighboring memory tile. For memory tiles near or at a border, boundary tiles may be positioned such that all the memory cells in the memory tiles 430 are all fully accessible. Because the memory device 900 includes active boundary portions 910 having the memory cells positioned above support circuitry, the memory device 900 may have an increased number of memory cells accessible as compared to the memory device 400 described in reference to FIG. 4. Additionally, the active boundary tiles 915 may include additional support components associated with the memory cells positioned above support circuitry in the active boundary tiles.

In some examples, the decks of memory cells 510-a may overlap the core portion 420-a and the boundary portions 910 of the substrate layer 505. Meaning of an array of memory cells may extend over or cover partly the core portion 420-a and the boundary portion 910 of the substrate layer 505. For example, at or near the intersection of the core portion 420 and the boundary portions 910 or the outer boundaries (e.g., as represented by border 935, 940, 950, and 960), memory cells may be absent. Alternatively, at or near the intersection of the core portion 420 and the boundary portions 910 or the outer boundaries (e.g., as represented by border 935, 940, 950, and 960), memory cells may be present extending beyond the corresponding support circuitry in the substrate layer.

Figure 11:
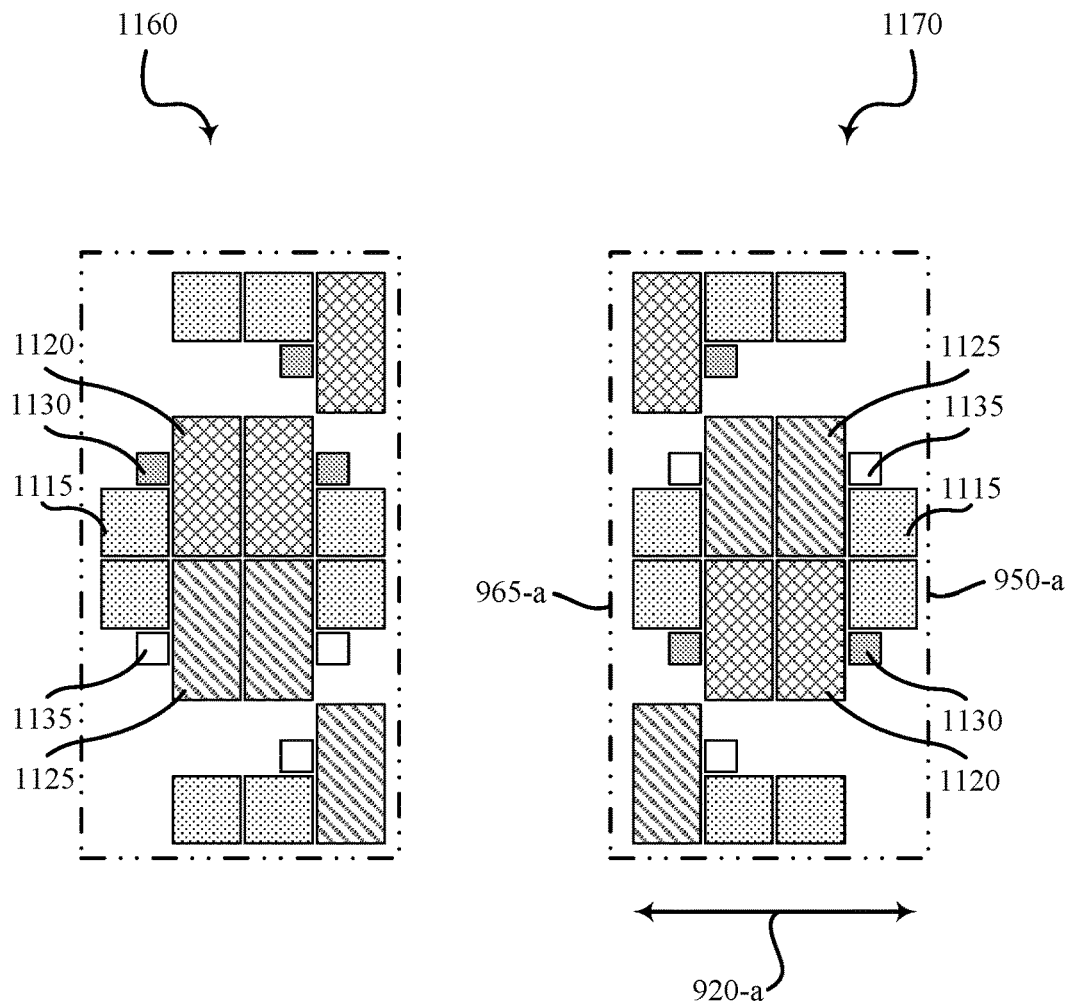
FIG. 11 illustrates an example of a boundary tile configuration that supports active boundary quilt architecture memory in accordance with embodiments of the present disclosure.

FIG. 11 illustrates an example of active boundary tile configurations 1100 that supports active boundary quilt architecture memory in accordance with embodiments of the present disclosure. FIG. 11 illustrates only components in the substrate layer for clarity. The active boundary tile configurations 1100 may include a first configuration 1160 and a second configuration 1170. To facilitate access to the memory cells positioned above the components in the substrate layer of active boundary portions 910, the active boundary tile configurations 1100 may include column line decoders 1115. The column line decoders 1115 may be coupled to column lines associated with the memory cells positioned above the components in the substrate layer of active boundary portion. The active boundary tile configurations 1100 may be an example of the active boundary tiles 915 described with reference to FIGS. 9 and 10. The active boundary tile configurations 1100 may be an example of the configurations 800 described with reference to FIG. 8.

The active boundary tile configurations 1170 may be configured and arranged to be positioned on a second border of the core portion (e.g., the right side of the core portion 420 shown in FIG. 9). For example, the active boundary tiles 915-a and 915-d may be arranged using the active boundary tile configuration 1170. In other examples, active boundary tile configuration 1160 may be configured and arranged to be positioned on a first border of the core portion 420 (e.g., the left side of the core portion 420 shown in FIG. 9). For example, the active boundary tiles 915-b and 915-c may be arranged using the active boundary tile configuration 1170.

In some examples, column line decoders 1115 may be positioned between row decoders (e.g., row line decoders 1120, 1125) and the control circuit portion as depicted in the active boundary tile configuration 1170. For example, column line decoders 1115 may be positioned between the first border 950-a and row line decoders 1120, 1125. The first border 950-a may be positioned opposite to the fourth border 965-a that defines the intersection of the core portion and the boundary portion. Column line decoders 1115, row line decoders 1120, row line decoders 1125, sense amplifiers 1130, and sense amplifiers 1135 may be examples of column decoders 615, row line decoders 620, row line decoders 625, sense amplifiers 630, and sense amplifiers 635, respectively, as described with reference to FIG. 6.

The active boundary tile configurations 1160 and 1170, each may include a number of decoders that is less than a number of decoders in a memory tile 430 of the core portion 420. For example, because memory cells are positioned above the active substrate layer of a boundary portion 910, the boundary tile configurations 1160 and 1170, each may include a number of column line decoders 1115. In some examples, the number of column line decoders 1115 is equal to half of a number of column line decoders 615 in a memory tile 430 of the core portion 420. In other examples, the boundary tile configurations 1160 and 1170, each includes fewer row decoders 1120, 1125 and fewer sense amplifiers 1130, 1135 than are present in a memory tile 430 of the core portion 420. In some examples, the number of decoders in the active boundary tile configurations 1160 and 1170, each may be less than half of the number of decoders in a memory tile 430 of the core portion 420.

FIG. 12 illustrates an example of a memory portion 1200 of a memory device that supports active boundary quilt architecture memory in accordance with embodiments of the present disclosure. FIG. 12 illustrates only components in the substrate layer and row lines for clarity. For example, portions of the memory tile may be omitted for clarity. In another example, row lines associated with different decks may be positioned at different heights in the memory device. As such, in some examples, row lines may overlap or may be stacked on top of one another. The row lines are shown offset in a two-dimensional arrangement for clarity purposes only. The memory portion 1200 may be an example of the memory portion 905 described with reference to FIG. 9. The memory portion 1200 shows the support components and some of the access lines of the memory tiles 430 and the active boundary tiles 915. In the illustrative examples of the memory portion, the memory tiles 430 and the active boundary tiles 915 are spaced apart to provide additional clarity about where each tile begins and ends. In some examples, the memory portion 1200 does not include the gaps between the memory tiles 430 and the active boundary tiles 915.

Some access lines may be truncated because these access lines are near or at a border. For example, various access lines 1215, which may be examples of row lines 705, 710 described with reference to FIG. 7, may be truncated at various borders between the memory portion 1200 and the control circuit portion (e.g., control circuit portion 415 of FIG. 4) of the memory device. Some truncated access lines are indicated as access lines 1215. Truncated access lines may have a length that is less than a common length of access lines. Other access lines, other than the ones indicated, may also be truncated. For example, some access lines coupled to decoders located in memory tiles of the active boundary portion may be shorter than access lines coupled to decoders located in memory tiles in the core portion. Some access lines coupled to decoders located in memory tiles in the core portion may have a length less than the common length. This may be because array of memory cells ends at an edge. In some examples, access lines coupled to a first deck may have a different length than access lines coupled to a second deck. Access lines (e.g., row lines) associated with different decks of memory cells may have different lengths. For example, row lines 710 associated with a higher deck may be longer than row lines 705 associated with a lower deck. In some examples, access lines from memory tiles in the active boundary portion may be coupled to memory cells positioned above a substrate layer of a memory tile within the core portion. In some examples, access lines from memory tiles in the active boundary portion may be coupled to memory cells positioned above a substrate layer of a memory tile within the active boundary portion. In some examples, access lines from memory tiles in the core portion may be coupled to memory cells positioned above a substrate layer of a memory tile within the active boundary portion. By coupling the memory cells positioned above a substrate layer of memory tiles in the active boundary portions, additional storage memory capacity in selected column regions may be provided.

Some access lines may be removed from the memory portion 1200 or may be inactive. Because certain memory cells are accessed using support components in neighboring tiles, certain areas of memory cells near the borders may not be accessible. In situations where a decoder is not present to access certain memory cells, the access line associated with that decoder may not be included in the memory portion 1200 or may be inactive. Some areas where access lines are omitted, inactive, or not included in the memory portion 1200 are indicated as areas 1210. Other areas, other than the ones indicated, may be present in the memory portion 1200.

Similarly to the description herein, in each of the memory tiles 430 in the core portion, the row lines may be coupled to memory cells in the memory array. A particular row line may be dedicated to a particular deck of memory cells. Row lines may also be associated with row line decoders for their respective deck. In the active boundary tiles 915, row decoders for each deck may be associated with corresponding row lines of the array that may not be associated with row decoders of memory tiles in the core portion. Such a configuration may allow accessing an increased number of memory cell, as described herein.

FIG. 13 illustrates an example of a memory portion 1300 of a memory device that supports active boundary quilt architecture memory in accordance with embodiments of the present disclosure. FIG. 13 illustrates only components in the substrate layer and row lines for clarity. For example, portions of the memory tile may be omitted for clarity. In another example, row lines associated with different decks may be positioned at different heights in the memory device. As such, in some examples, row lines may overlap or may be stacked on top of one another. The row lines are shown offset in a two-dimensional arrangement for clarity purposes only. The memory portion 1300 may be an example of memory portions 905, 1200 described with reference to FIGS. 9, 10, and 12. The memory portion 1300 shows the memory portion 1200 with column lines 1305 added. The column lines 1305 may be examples of the digit lines 115 described with reference to FIGS. 1 and 2. In some instances, the column lines 1305 may be examples of the digit lines 115 described with reference to FIGS. 1 and 2. References to word lines and bit lines, or their analogues are interchangeable without loss of understanding or operation. The column lines 1305 may be coupled to multiple decks of memory cells. In some instances, the column lines 1305 may be positioned between row lines (e.g., row lines 705, 710 as described with reference to FIG. 7). For example, a column line 1305 may be positioned above one row line 705, and another row line 710 may be positioned above a column line 1305 as depicted in the cross-section view 780 in FIG. 7. Column lines 1305 may be coupled to or associated with column line decoders in the memory tiles (either in the core portion or the active boundary portion) as described herein.

In some examples, an active memory cell in the array of memory cells is coupled to both a row line (e.g., row line 705 or row line 710 depending on the deck) and a column line 1305. The column line 1305 extends perpendicular to the row lines 705, 710, in some examples. An active memory cell may be an example of a memory cell that includes both a row address and a column address or is accessible by a memory controller. A column line 1305 may define a common length for multiple column lines 1305. In some examples, a column line 1305 may have a length that is different from the common length. For example, a column line 1305 may be shorter or longer than the common length.

The memory portion 1300 may include four memory tiles as shown in FIG. 13 as an illustrative example. Each memory tile may be further broken into regions 1320. FIG. 13 illustrates that a memory tile is broken into eight regions, as denoted by index numbers 0 through 7. While eight regions are shown in the illustrative example of FIG. 13, other numbers of regions may be configured. A region may be associated with a plurality of column lines. Additionally, each region may be indexed to represent a subset of column addresses. The column lines 1305 positioned in a region as depicted in FIG. 3 may represent a single column in the particular region that may be accessed at a certain access operation. As used herein, access operations may refer to read operations (i.e., sense operations) or write operations. The size of memory tiles in active boundary portions may be equal to or smaller than the size of memory tiles in the core portions. As an example, the size of memory tiles in active boundary portions may be approximately one-half size of memory tiles in the core portions, hence having one-half index number of regions, i.e., four regions, as denoted by index numbers 0 through 3 and 4 through 7, respectively in FIG. 13.

In some cases, the memory device, which may be referred to as an electronic memory device, may include a substrate layer that includes a core portion, boundary portions, and a control circuit portion, where the core portion includes a first border and a second border positioned opposite to the first border, the first border adjoining a first boundary portion and the second border adjoining a second boundary portion, and where the first boundary portion includes a first plurality of decoders having a first configuration, the second boundary portion includes a second plurality of decoders having a second configuration, the core portion includes a third plurality of decoders having a third configuration, and the control circuit portion may be exclusive of the first, the second, and the third plurality of decoders, and an array of memory cells that overlies the core portion and at least a part of the first boundary portion and the second boundary portion of the substrate layer, where memory cells of the array are coupled with the first plurality of decoders, the second plurality of decoders, and the third plurality of decoders via a plurality of access lines. In some cases, the first plurality of decoders, the second plurality of decoders, and the third plurality of decoders each include a plurality of column decoders. In some cases, the column decoders in the first boundary portion are associated with memory cells of the array that overlie the first boundary portion, the column decoders in the second boundary portion are associated with memory cells of the array that overlie the second boundary portion, and the column decoders in the core portion are associated with memory cells of the array that overlie the core portion. In some cases, an active memory cell in the array of memory cells may be coupled to a first access line and a second access line extending perpendicular to the first access line.

In some cases, at least one decoder of the third plurality of decoders is coupled with a memory cell of the array that overlies the first boundary portion or the second boundary portion, at least one decoder of the first plurality of decoders is coupled with a memory cell of the array that overlies the core portion, and at least one decoder of the second plurality of decoders is coupled with a memory cell of the array that overlies the core portion. In some cases, at least one decoder of the first plurality of decoders is coupled with a memory cell of the array that overlies the first boundary portion and at least one decoder of the second plurality of decoders is coupled with a memory cell of the array that overlies the second boundary portion. In some cases, the core portion of the substrate layer comprises a plurality of sections that each include a common configuration of components. In some cases, the first boundary portion of the substrate layer includes a plurality of sections that each include a same configuration of components as other sections of the first boundary portion, and the second boundary portion of the substrate layer comprises a plurality of sections that each include a same configuration of components as other sections of the second boundary portion. In some cases, the sections of the first boundary portion may have a different configuration from the sections of the core portion and the sections of the second boundary portion, and the sections of the second boundary portion have a different configuration from the sections of the core portion.

In some cases, each section of the core portion is defined by a first dimension in a first direction and a second dimension in a second direction that is orthogonal to the first direction; and each section of the first boundary portion and the second boundary portion is defined by a third dimension in the first direction and a fourth dimension in the second direction, where the third dimension is less than or equal to the first dimension and the fourth dimension is equal to the second dimension. In some cases, the third dimension of the first boundary portion is different than the third dimension of the second boundary portion.

In some cases, at least one section of the first boundary portion includes a first number of decoders, at least one section of the second boundary portion includes a second number of decoders, and at least one section of the core portion includes a third number of decoders, where the first number is less than or equal to the second number, and the third number is greater than or equal to the second number. In some cases, the first number of decoders and the second number of decoders are less than half of the third number of decoders. In some cases, the decoders of the first boundary portion include a first plurality of column decoders and the decoders of the second boundary portion include a second plurality of column decoders, where the pluralities of column decoders each are proportional to a corresponding number of decoders in the first boundary portion and the second boundary portion. In some cases, a portion of the array of memory cells that overlies the first boundary portion and the second boundary portion of the substrate layer produces extra outputs in addition to outputs produced by the array of memory cells that overlies the core portion because the first boundary portion and the second boundary portion include active memory cells. In some cases, a portion of the array of memory cells that overlies the first boundary portion of the substrate layer is associated with the column decoders in the first boundary portion and either the first plurality of decoders or the third plurality of decoders, and a portion of the array of memory cells that overlies the second boundary portion of the substrate layer is associated with the column decoders in the second boundary portion and either the second plurality of decoders or the third plurality of decoders.

In some cases, a portion of the array that overlies the first boundary portion and the second boundary portion of the substrate layer is associated with a first operational purpose that is different than a second operational purpose associated with a portion of the array that overlies the core portion of the substrate layer. For example, the different operational purposes may include auxiliary functions for array management, such as redundancy implementations or error correction code (ECC) applications, etc. In some cases, the array of memory cells comprises a three-dimensional cross-point array and each cell in the array comprises a selector device and a logic storage element in series configuration. In some cases, the selector device includes a chalcogenide material having bi-directional switching characteristics and the logic storage element includes another chalcogenide material with a resistance that is based at least in part on a crystalline property. In some cases, each cell of the array comprises a chalcogenide material with bidirectional switching and memory characteristics. In some cases, the selector device includes a thin-film transistor (TFT) and the logic storage element includes a ferroelectric container having a ferroelectric material. In some cases, the array of memory cells comprises at least two decks of memory cells, a first deck of memory cells positioned over the core portion, the first boundary portion, and the second boundary portion, and a second deck of memory cells positioned over the first deck of memory cells. In some cases, the core portion, the first boundary portion, and the second boundary portion comprise a CMOS under array (CuA). In some cases, the core portion further includes a third border and a fourth border positioned opposite to the third border, the third border adjoining a third boundary portion and the fourth border adjoining a fourth boundary portion, and where the third boundary portion and the fourth boundary portion each include a plurality of column decoders; and the plurality of column decoders are associated with memory cells of the array that overlie the core portion. In some cases, a portion of the array of memory cells that overlies the core portion of the substrate layer is associated with one of the column decoders in the core portion, the third boundary portion, or the fourth boundary portion and one of the first plurality of decoders, the second plurality of decoders, or the third plurality of decoders. In some cases, the device further includes a first subset of access lines extends across the first border where the first subset of access lines is coupled with the memory cells that overlie the first boundary portion and a second subset of access lines extends across the second border where the second subset of access lines is coupled with the memory cells that overlie the second boundary portion. In some cases, at least one access line of the first subset of access lines has a different length than another access line of the first subset of access lines and at least one access line of the second subset of access lines has a different length than the other access line of the first subset of access lines or another access line of the second subset of access lines, or both.

Figure 14:
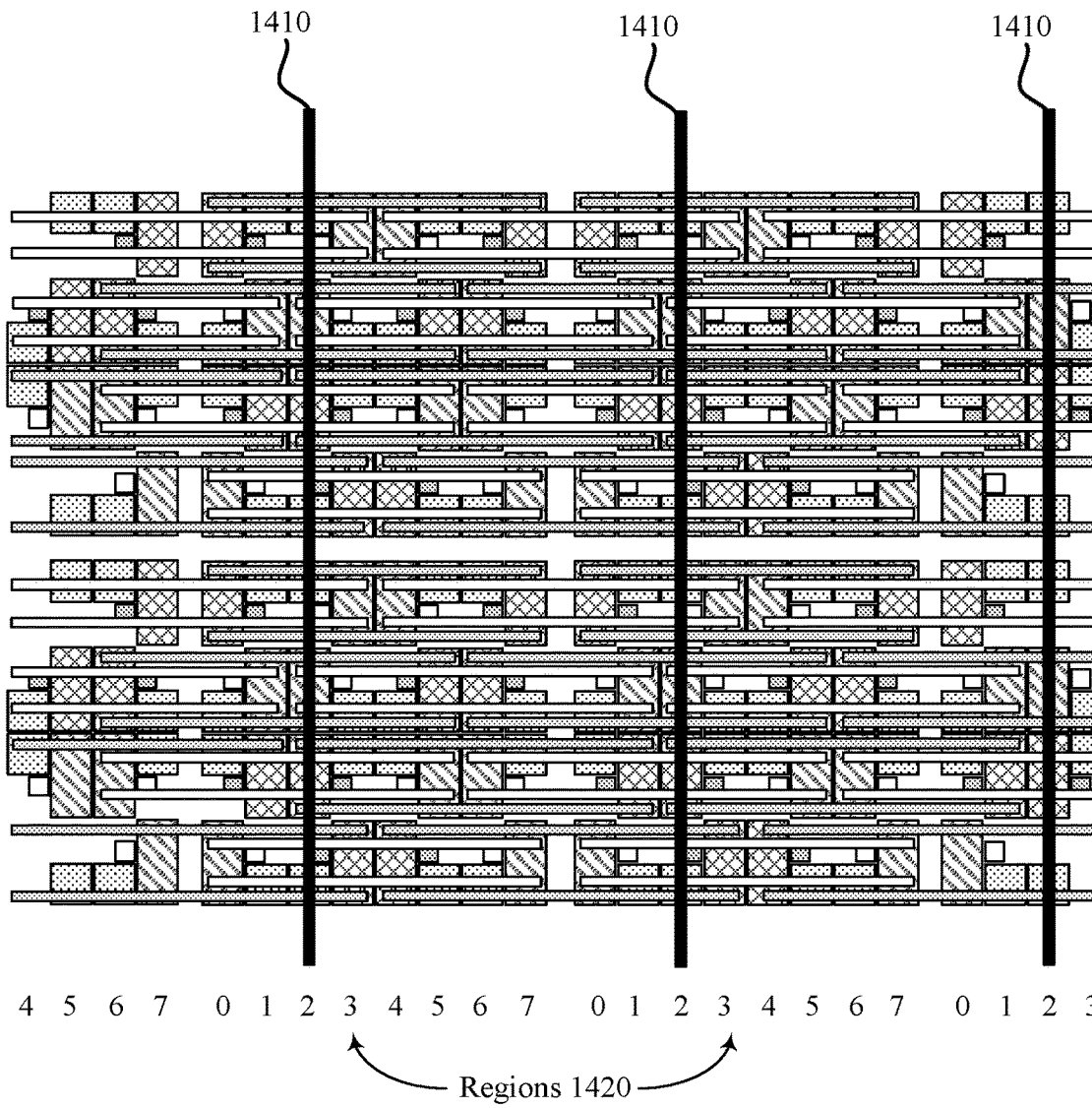

FIG. 14 illustrates an example of a memory portion 1400 of a memory device that supports active boundary quilt architecture memory in accordance with embodiments of the present disclosure. The memory portion 1400 may be an example of memory portions 905, 1200, and 1300 described with reference to FIGS. 9, 10, 12, and 13. The memory portion 1400 may be illustrated to show how access operations may be used with the memory device 900 in FIG. 9. The memory portion 1400 illustrates two by two exemplary arrangement of memory tiles adjoined by active boundary portions. The memory portion 1400 shows the support components and some of the access lines of the memory tiles 430 and the active boundary tiles 915. In the illustrative examples of the memory portion, the memory tiles 430 and the active boundary tiles 915 are spaced apart to provide additional clarity about where each tile begins and ends. Column lines other than column lines 1410 are omitted in FIG. 14 for illustrative purposes only.

The memory portion 1400 may be broken into regions 1420. The memory portion 1400 may include eight regions (regions index numbers zero through seven). A region may comprise a collection of column lines 1305. As used herein, access operations may refer to read operations (i.e., sense operations) or write operations. While eight regions 1420 are shown in FIG. 14, other numbers of regions may be configured.

During an access operation, a memory controller may activate one or more of the regions. The activated regions may include regions having a same index in the core portion and boundary portions and may be referred to as a group with the same index. For example, the memory controller may activate regions denoted with index two (2) as depicted in FIG. 14. A number of memory cells are coupled to the column lines in regions with index two (2) via the row lines that intersect the column lines in regions with index two (2). In some examples, the number of access operations in a region is equal to the number of intersections of row lines and column lines 1410 in the region.

In memory portion 1400, each group of regions having a same index is capable of producing a certain number of access operations. For example, in the illustrative example of memory portion 1400, regions denoted with indices zero, one, six, and seven may each be able to produce eighty-eight access operations. The eighty-eight access operations may be achieved by sixty-four access operations from the memory tiles 430, namely, thirty-two access operations per region multiplied by two (because there are two regions denoted with indices zero, one, six, or seven) within the exemplary tiles 430, in addition to twenty-four access operations from a region in the active boundary tile 915 (or portion) denoted with indices zero, one, six, or seven. The regions denoted with indices zero, one, six, and seven in the active boundary tile 915 (or portion) may produce a less number of access operations than the regions in the memory tile 430, but a more number of access operations than the regions in the active boundary portion denoted with indices two, three, four, or five. This is due to the fact that some cells positioned in the active boundary portions may not be accessible because the cells are near the border and row lines may be omitted or inactive near the border, as described with reference to FIG. 12.

Additionally, in memory portion 1400, regions denoted with indices two through five may each be able to produce eighty access operations. The eighty access operations may be achieved by sixty-four access operations from the memory tiles 430, as described above, in addition to sixteen access operations from a region in the active boundary tile 915 (or portion) denoted with indices two, three, four, or five. The regions denoted with indices two, three, four, or five in the active boundary portions may produce a less number of access operations than the regions denoted with indices zero, one, six, and seven because they are located farther away from the memory tiles 430 and even more number of row lines may be omitted or inactive compared to the regions denoted with indices zero, one, six, and seven. In other words, in the illustrative example of FIG. 14, regions with indices two through five in the active boundary portions have relatively less number of row lines intersecting with its column lines as compared to the regions with indices zero, one, six, and seven in the active boundary portions, such that regions with indices two through five produce a less number of access operations than the regions with indices zero, one, six, and seven. It should be appreciated that the particular numbers of access operations described above are illustrative purpose only to show how the active boundary portions may be implemented to increase the total number of access operations and the number of access operations may vary depending on how memory tiles and boundary tiles are designed and constructed. In addition, it should be appreciated that FIG. 14 may represent only a portion of a memory array. As such, the principles outlined may be expanded to cover additional and/or larger implementations.

It should be appreciated that number of the regions in the active boundary portion may be flexible by varying the size of the active boundary portion (i.e., number of memory cells in the boundary portions) and support components therein (i.e., row decoders, sense components, and column decoders). Precise determination of the size of the active boundary portion may be tailored to particular memory capacity requirements pertinent to specific purposes. Additionally, the number of access operations that each region is capable of producing may vary depending on the size of the memory portion 1400. For example, as the memory portion 1400 gets larger, the number of access operation that a region is capable of producing may increase.

Figure 15:
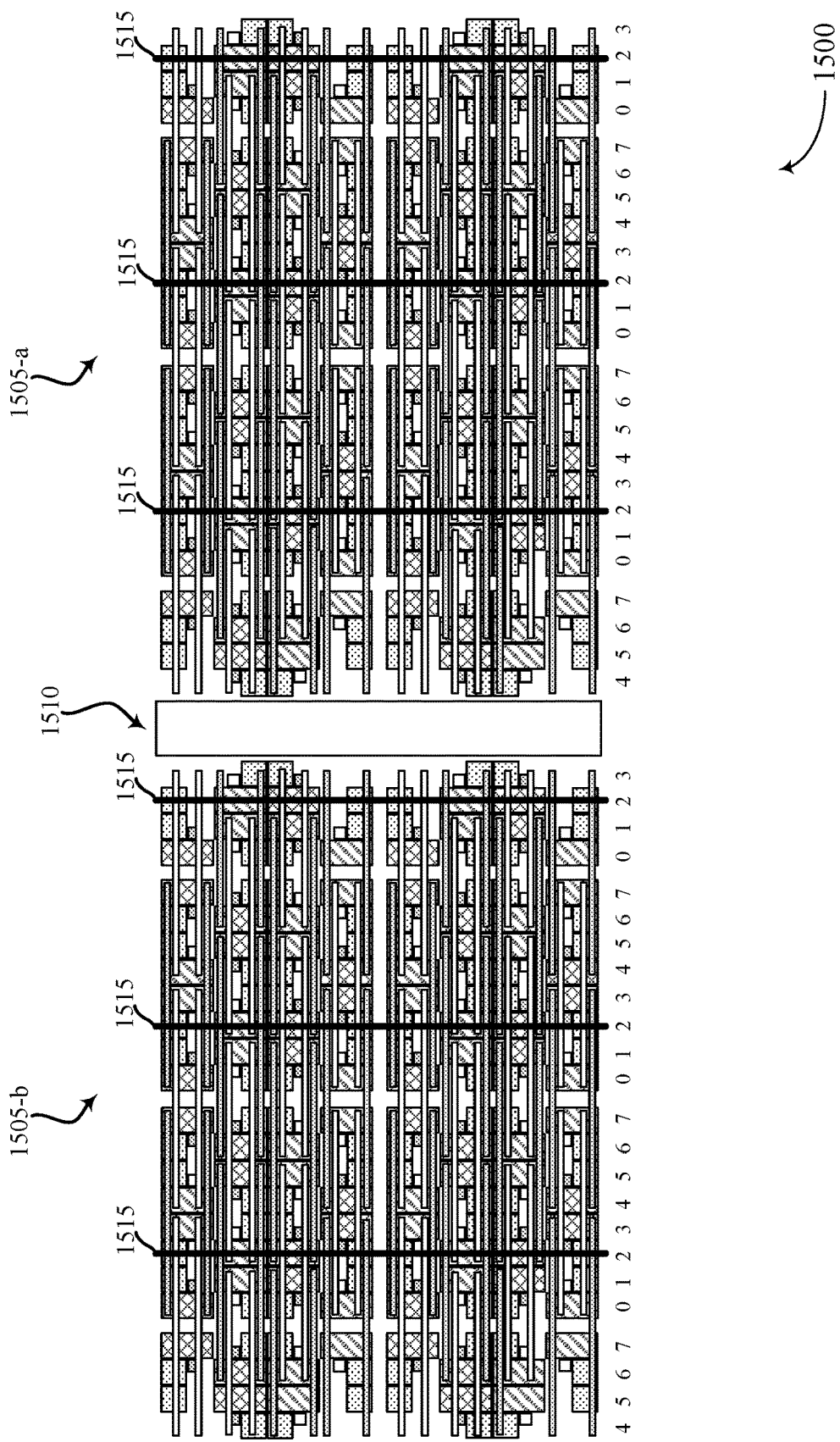
FIGS. 15 and 16 illustrate an example of a portion of a memory device that supports active boundary quilt architecture memory in accordance with embodiments of the present disclosure.

FIG. 15 illustrates an example of a portion 1500 of a memory device that supports active boundary quilt architecture memory in accordance with embodiments of the present disclosure. The portion 1500 may include two memory portions 1505 with a control circuit portion 1510 positioned in between. The memory portions 1505 may be an example of memory portions 905, 1200, 1300, and 1400 described with reference to FIGS. 9, 10, 12, 13, and 14. The control circuit portion may be configured to provide an addressing scheme to concurrently access regions of both memory portions 1505. For example, when the regions denoted with an index two (2) are selected, the control circuit portion activates column lines 1515 of the regions denoted with the index two (2) in order to produce access operations associated with the column lines 1515 and the row lines in the regions denoted with the index two (2). The other column lines were omitted for illustration purposes in FIG. 15.

In the illustrative portion 1500, regions denoted with indices zero, one, six, and seven may each be able to produce one hundred seventy-six access operations, namely twice of eighty-eight access operations. Some cells positioned in the active boundary portions may not be accessible because the cells are near the border and row lines may be omitted or inactive near the border, as described with reference to FIG. 12 and FIG. 14. Additionally, in the illustrative memory portion 1500, regions denoted indices with two through five may each be able to produce one hundred sixty access operations, namely twice of eighty access operations. In the illustrative example, regions denoted with indices two through five in the boundary portions have relatively less number of live row lines as compared to the regions denoted with indices zero, one, six, and seven in the active boundary portions, such that the regions denoted with indices two through five produces a less number of access operations. Nonetheless, the number of access operations is increased with the scheme of active boundary portions as compared to the number of access operations without the memory cells positioned in the boundary portions, namely one-hundred twenty-eight access operations for each regions, namely twice of sixty-four access operations. It should be appreciated that the illustrative example of FIG. 15 provides at least thirty-two additional access operations always, up to forty-eight additional access operations maximum.

Figure 16:
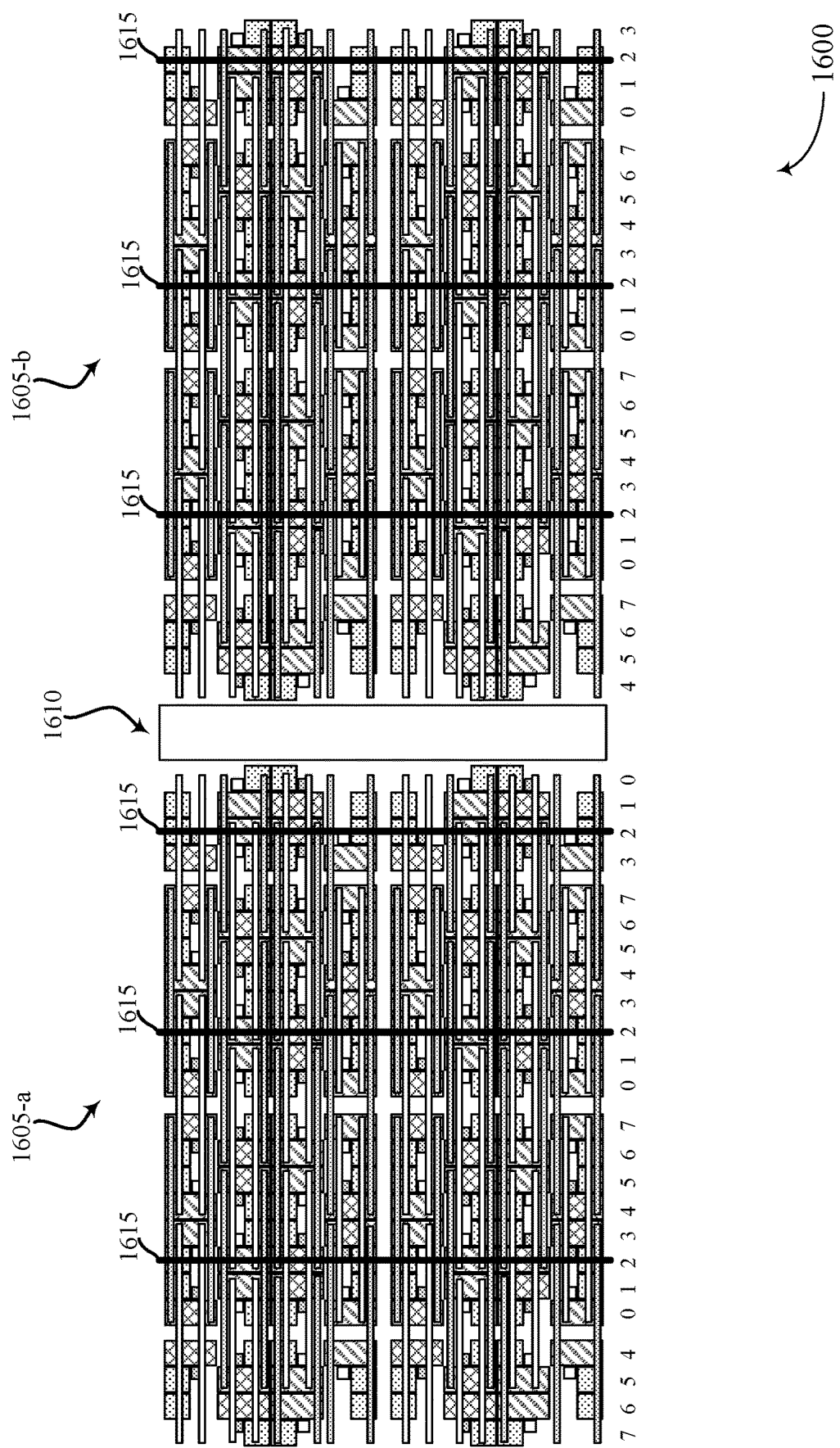

FIG. 16 illustrates an example of a portion 1600 of a memory device that supports active boundary quilt architecture memory in accordance with embodiments of the present disclosure. The memory portion 1600 may include two memory portions 1605 with a control circuit portion 1610 positioned in between. The memory portions 1605 may be an example of memory portions 905, 1200, 1300, and 1400 described with reference to FIGS. 9, 10, 12, 13, and 14. The control circuit portion may be configured to provide addressing scheme to concurrently access regions of both memory portions 1605. For example, when regions denoted with an index two are selected, the control circuit portion activates column lines 1615 of the regions denoted with the index two in order to produce access operations associated with column lines 1615 and the row lines in the regions denoted with the index two.

It should be appreciated that the regions associated with memory portion 1605-b maintain the same configuration with the regions associated with memory portion 1505-b whereas the regions associated with memory portion 1605-a has different addressing scheme than that of memory portion 1505-a, for the regions associated with the active boundary portions. In other words, a different group of regions are to be identified with an identical or same index for the group in light of the different addressing scheme. Under this scheme of address scrambling, in the illustrative memory portion 1605, all of the regions denoted with indices zero through seven, i.e., group indices zero through seven, each is capable of producing one-hundred sixty-eight access operations, one at each crossing of a row line and a column line in FIG. 16. This is achieved by designating different regional indexes so as to provide the same number of additional access operations throughout the regions in the boundary portions. In this example of the memory portion 1600, the one hundred sixty-eight access operations may be achieved by one hundred twenty-eight access operations from the memory tiles in the core portion, namely, thirty-two access operations per a region multiplied by four (because there are now four regions, each denoted with indices zero through seven) in the core portion, in addition to forty access operations from two regions in the active boundary portion denoted with indices zero through seven. Due the scheme of address scrambling, each regions denoted with indices zero through seven in the active boundary portion may produce an even number of access operations throughout the active boundary portions. The number of access operations may be construed as the number of crossings of a row line and a column line, one access operation at each crossing. Hence, it should be appreciated that in the illustrative example of FIG. 16, the portion 1600 provides forty additional or extra access operations always, uniformly across the entire regions by means of the address scrambling scheme as compared to the number of access operations without the memory cells positioned in the active boundary portions, namely one-hundred twenty-eight access operations for each region.

In some cases, the memory device includes a substrate layer that includes a plurality of control circuit portions and a plurality of memory segments, each memory segment comprising a core portion and boundary portions, where the boundary portions include a first boundary portion that includes a first plurality of decoders having a first configuration and a second boundary portion that includes a second plurality of decoders having a second configuration, the core portion includes a third plurality of decoders having a third configuration, and the control circuit portions may be exclusive of the first, the second, and third plurality of decoders. The substrate layer may be configured with the control circuit portions adjacent to the memory segments in an alternating pattern of control circuit portions and memory segments, where the first boundary portion of each memory segment adjoins a first border of the core portion of the memory segment and the second boundary portion of the memory segment adjoins a second border of the core portion opposite to the first border. The memory device may also include an array of memory cells that overlies the core portion and at least a part of the first boundary portion and the second boundary portion of each memory segment, where a portion of the array memory cells overlying each memory segment is coupled with the first plurality of decoders, the second plurality of decoders, and the third plurality of decoders of the memory segment via a plurality of access lines. In some cases, a portion of the array of memory cells that overlies the first boundary portion and the second boundary portion includes active memory cells and thus produces extra outputs in addition to outputs produced by the array of memory cells that overlies the core portion.

In some cases, the core portion of the substrate layer includes a plurality of sections that each include a common configuration of components, and where each section of the core portion includes a plurality of regions that each are indexed to represent a subset of column addresses; the first boundary portion of the substrate layer includes a plurality of sections that each include a same configuration of components as other sections of the first boundary portion, where the sections of the first boundary portion have a different configuration of components from the sections of the core portion, and where each section of the first boundary portion includes a plurality of regions that each are indexed to represent a subset of column addresses; and the second boundary portion of the substrate layer includes a plurality of sections that each include a same configuration of components as other sections of the second boundary portion, where the sections of the second boundary portion have a different configuration of components from the sections of the first boundary portion and the sections of the core portion, and where each section includes a plurality of regions that each are indexed to represent a subset of column addresses. In some cases, a plurality of memory cells associated with a plurality of regions having an identical or same index from the first boundary portion, the second boundary portion, and the core portion are grouped to produce a uniform or nearly uniform number of outputs throughout pluralities of memory cells associated with pluralities of regions having different indices by scrambling indices associated with the plurality of regions. In some cases, the configuration of the substrate layer includes each portion of the plurality of control circuit portions adjacent to at least two memory segments. In some cases, a quantity of regions in each section of the first boundary portion and the second boundary portion is less than or equal to a quantity of regions in each section of the core portions. In some cases, the configuration of the substrate layer comprises each memory segment adjacent to at least two portions of the plurality of control circuit portions. In some cases, a quantity of regions in each section of the first boundary portion and the second boundary portion is less than or equal to a quantity of regions in each section of the core portions.

Figure 17:
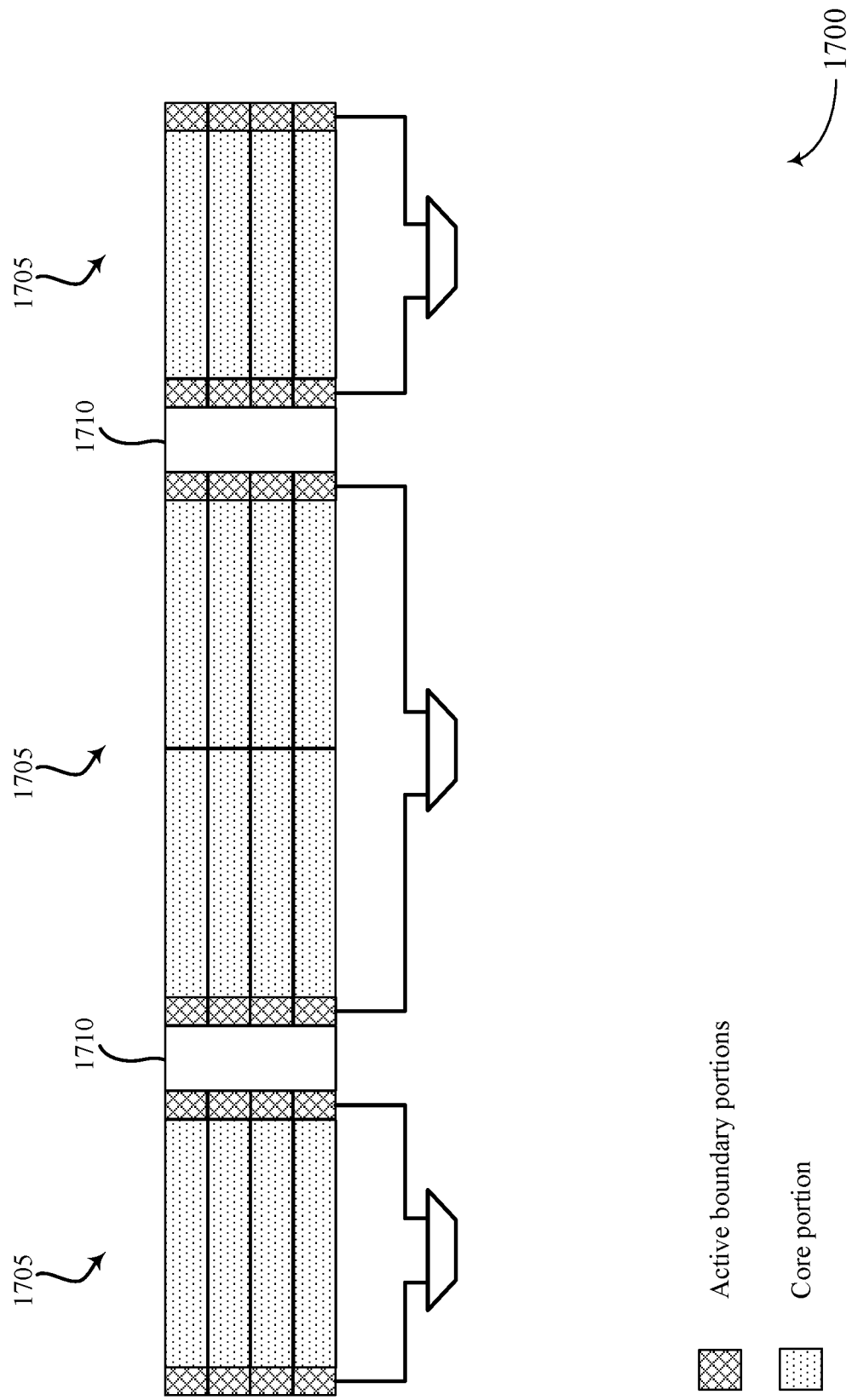
FIGS. 17 and 18 illustrate examples of a device that supports active boundary quilt architecture memory in accordance with embodiments of the present disclosure.

FIG. 17 illustrates an examples of a memory device 1700 that supports active boundary quilt architecture memory in accordance with embodiments of the present disclosure. The memory portions 1705 may be an example of memory portions 905, 1200, 1300, and 1400 described with reference to FIGS. 9, 10, 12, 13, and 14. The control circuit portion 1710 may be configured to provide addressing scheme to support access operations in conjunction with decoders in the core portions and the boundary portions as well as the column decoders.

Figure 18:
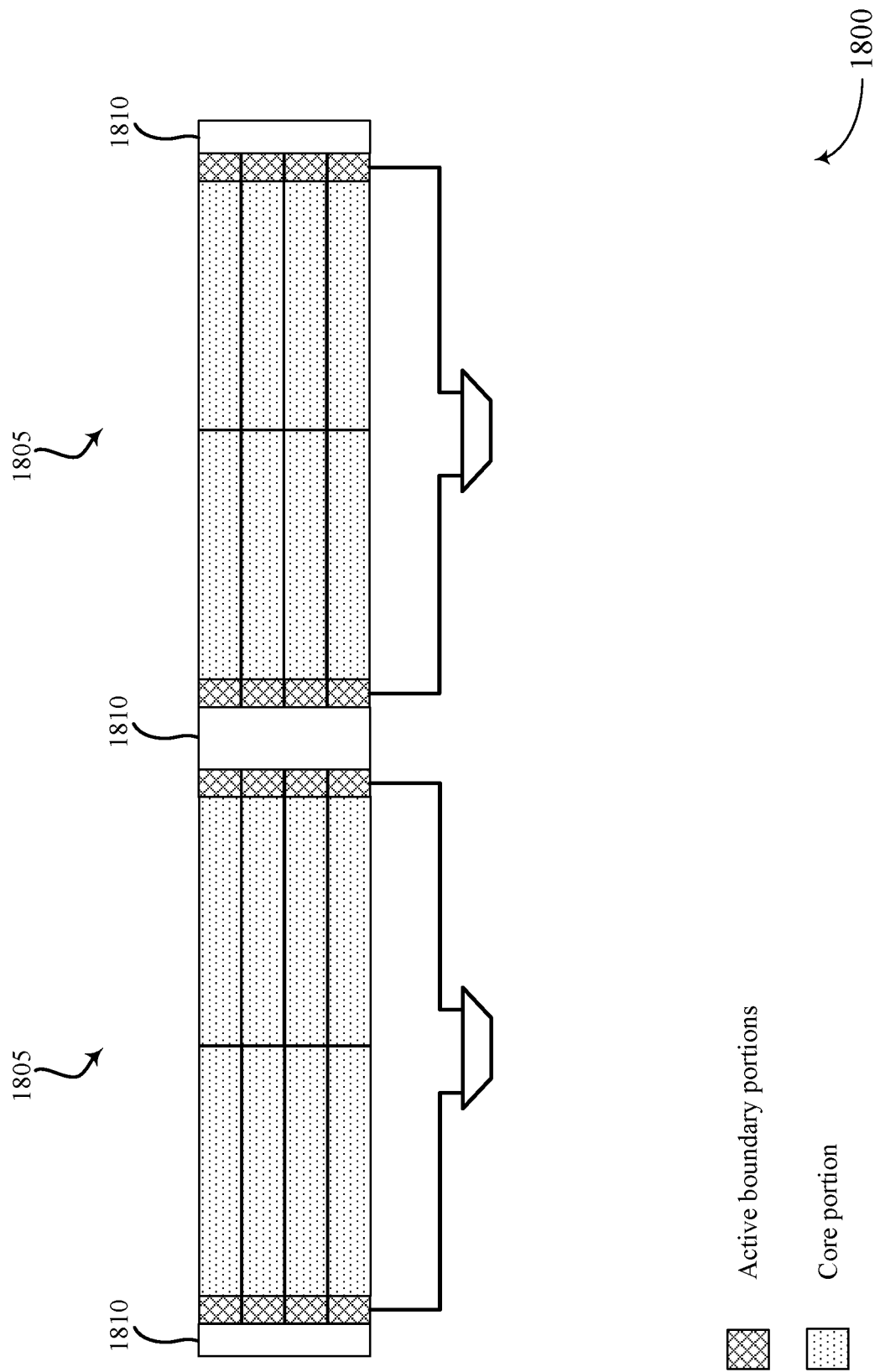

FIG. 18 illustrates an example of a memory device 1800 that supports active boundary quilt architecture memory in accordance with embodiments of the present disclosure. The memory portions 1805 may be an example of memory portions 905, 1200, 1300, and 1400 described with reference to FIGS. 9, 10, 12, 13, and 14. The control circuit portion 1810 may be configured to provide addressing scheme to support access operations in conjunction with decoders in the core portions and the boundary portions as well as the column decoders.

Figure 19:
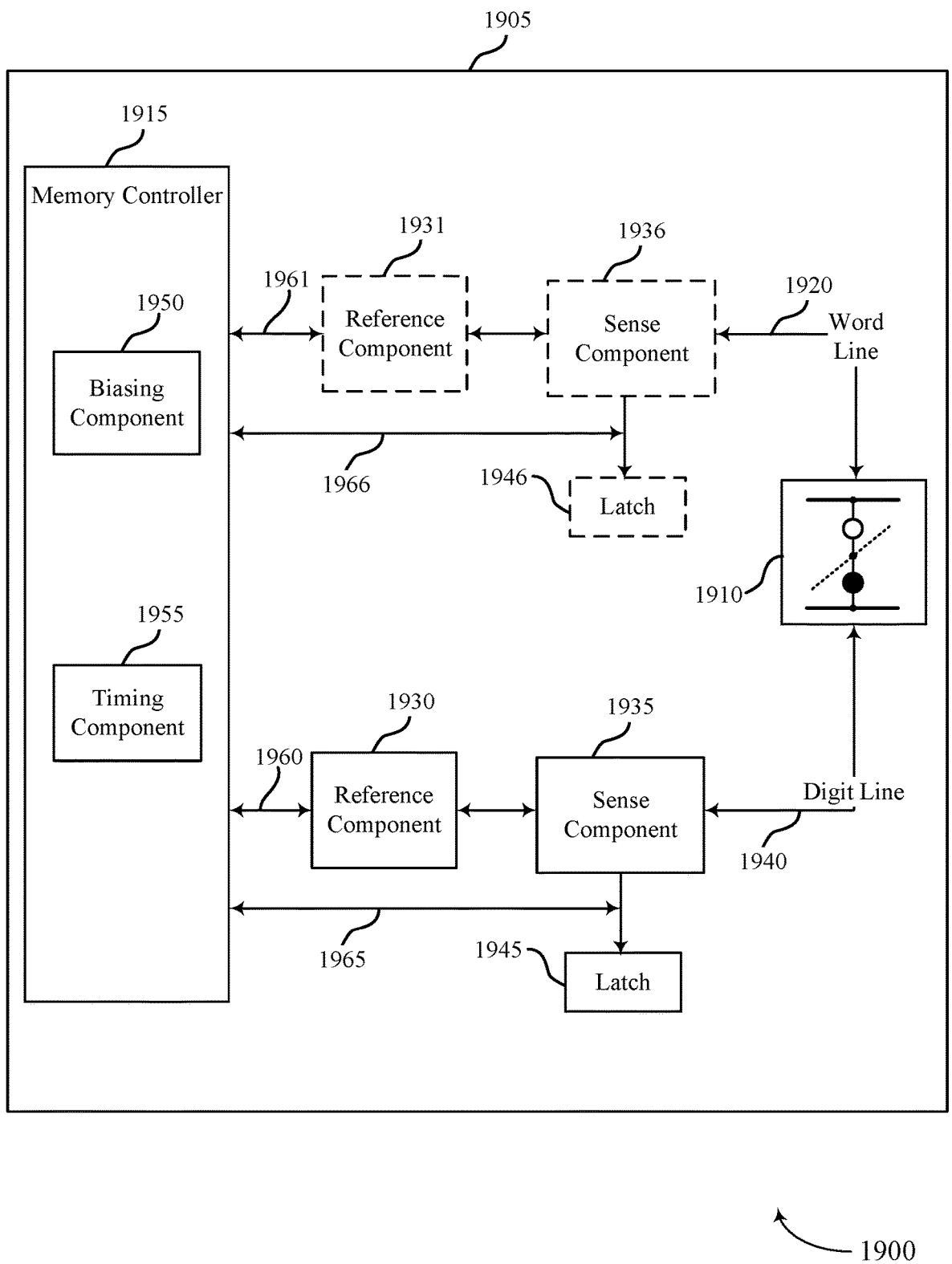
FIG. 19 shows a block diagram of a device including a memory controller that supports active boundary quilt architecture memory in accordance with embodiments of the present disclosure.

FIG. 19 shows a block diagram 1900 of a device including a memory controller 1915 that supports active boundary quilt architecture memory in accordance with embodiments of the present disclosure. Memory array 1905 may be referred to as an electronic memory apparatus, and memory controller 1915 may be an example of a component of a memory controller 140 as described with reference to FIGS. 1 and 2. Also, FIG. 19 shows an alternative schematic option of arranging sense component 1936, latch 1946, and reference component 1931 (in dashed boxes). An ordinary person skilled in the art would appreciate that sense component and associated components (i.e., latch and reference component) may be associated either with column decoder or row decoder without losing their functional purposes.

Memory array 1905 may include one or more memory cells 1910, a memory controller 1915, a word line 1920, a reference component 1930, a sense component 1935, a digit line 1940, and a latch 1945. These components may be in electronic communication with each other and may perform one or more of the functions described herein. In some cases, memory controller 1915 may include biasing component 1950 and timing component 1955.

Memory controller 1915 may be in electronic communication with word line 1920, digit line 1940, and sense component 1935, which may be examples of word line 110, digit line 115, and sense component 125 described with reference to FIGS. 1, and 2. Memory array 1905 may also include reference component 1930 and latch 1945. The components of memory array 1905 may be in electronic communication with each other and may perform some of the functions described with reference to FIGS. 1 through 18. In some cases, reference component 1930, sense component 1935, and latch 1945 may be components of memory controller 1915.

In some examples, digit line 1940 is in electronic communication with sense component 1935 and a storage element of memory cells 1910. In some examples, the storage element may be a ferroelectric capacitor and the memory cell 1910 may be a ferroelectric memory cell. In FIG. 19, the memory cell is shown only as a schematic example omitting certain elements that may be memory technology specific for simplicity. In some examples, the storage element may include a chalcogenide phase change material and/or the memory cell 1910 may be a phase-change memory cell. A memory cell 1910 may be writable with a logic state (e.g., a first or second logic state). Word line 1920 may be in electronic communication with memory controller 1915 and a selector device of memory cell 1910. Sense component 1935 may be in electronic communication with memory controller 1915, digit line 1940, latch 1945, and reference line 1960. Reference component 1930 may be in electronic communication with memory controller 1915 and reference line 1960. Sense control line 1965 may be in electronic communication with sense component 1935 and memory controller 1915. These components may also be in electronic communication with other components, both inside and outside of memory array 1905, in addition to components not listed above, via other components, connections, or busses.

Memory controller 1915 may be configured to activate word line 1920 and digit line 1940 by applying voltages to those various nodes. For example, biasing component 1950 may be configured to apply a voltage to operate memory cell 1910 to read or write memory cell 1910 as described above. In some cases, memory controller 1915 may include a row decoder, column decoder, or both, as described with reference to FIG. 1. This may enable memory controller 1915 to access one or more memory cells 105. Biasing component 1950 may also provide voltage potentials to reference component 1930 in order to generate a reference signal for sense component 1935. Additionally, biasing component 1950 may provide voltage potentials for the operation of sense component 1935. In some examples, Reference component 1931 may be in electronic communication with memory controller 1915 and reference line 1961. Sense control line 1966 may be in electronic communication with sense component 1936 and memory controller 1915. Such a configuration may be in addition to or an alternative to a configuration that includes reference component 1930, sense component 1935, and latch 1945. These components may also be in electronic communication with other components, both inside and outside of memory array 1905, in addition to components not listed above, via other components, connections, or busses.

In some cases, memory controller 1915 may perform its operations using timing component 1955. For example, timing component 1955 may control the timing of the various word line selections and digit line selections, including timing for switching and voltage application to perform the memory functions, such as reading and writing, discussed herein. In some cases, timing component 1955 may control the operations of biasing component 1950.

Reference component 1930 may include various components to generate a reference signal for sense component 1935. Reference component 1930 may include circuitry configured to produce a reference signal. In some cases, reference component 1930 may be implemented using other memory cells 105. Sense component 1935 may compare a signal from memory cell 1910 with a reference signal from reference component 1930. Upon determining the logic state, the sense component may then store the output in latch 1945, where it may be used in accordance with the operations of an electronic device that memory array 1905 is a part. Sense component 1935 may include a sense amplifier in electronic communication with the latch and the memory cell.

In some cases, the electronic memory apparatus includes a substrate layer that comprises a core portion, a first boundary portion, a second boundary portion, and a control circuit portion, where the first boundary portion includes a first plurality of decoders having a first configuration, the second boundary portion includes a second plurality of decoders having a second configuration, the core portion includes a third plurality of decoders having a third configuration, and the control circuit portion may be exclusive of the first, the second, and the third plurality of decoders and an array of memory cells that overlies the core portion and at least a part of the first boundary portion and the second boundary portion of the substrate layer, wherein memory cells of the array are coupled with the first plurality of decoders, the second plurality of decoders, and the third plurality of decoders via a plurality of access lines.

Memory controller 1915 may be in electronic communication with the substrate layer and the array of memory cells, where the controller is operable to: identify, for an access operation, a region of the array of memory cells positioned over the first boundary portion and the second boundary portion of the substrate layer and execute the access operation on memory cells of the identified region using decoders of the first plurality of decoders, the second plurality of decoders, or the third plurality of decoders in conjunction with a column decoder of a boundary portion above which the memory cells are located. In some examples, the control circuit portion may be exclusive of row decoders, column decoders, sense amplifiers, or combinations thereof. In some examples, memory cells 1910 may comprise PCM or chalcogenide-material-based memory cells.

Figure 20:
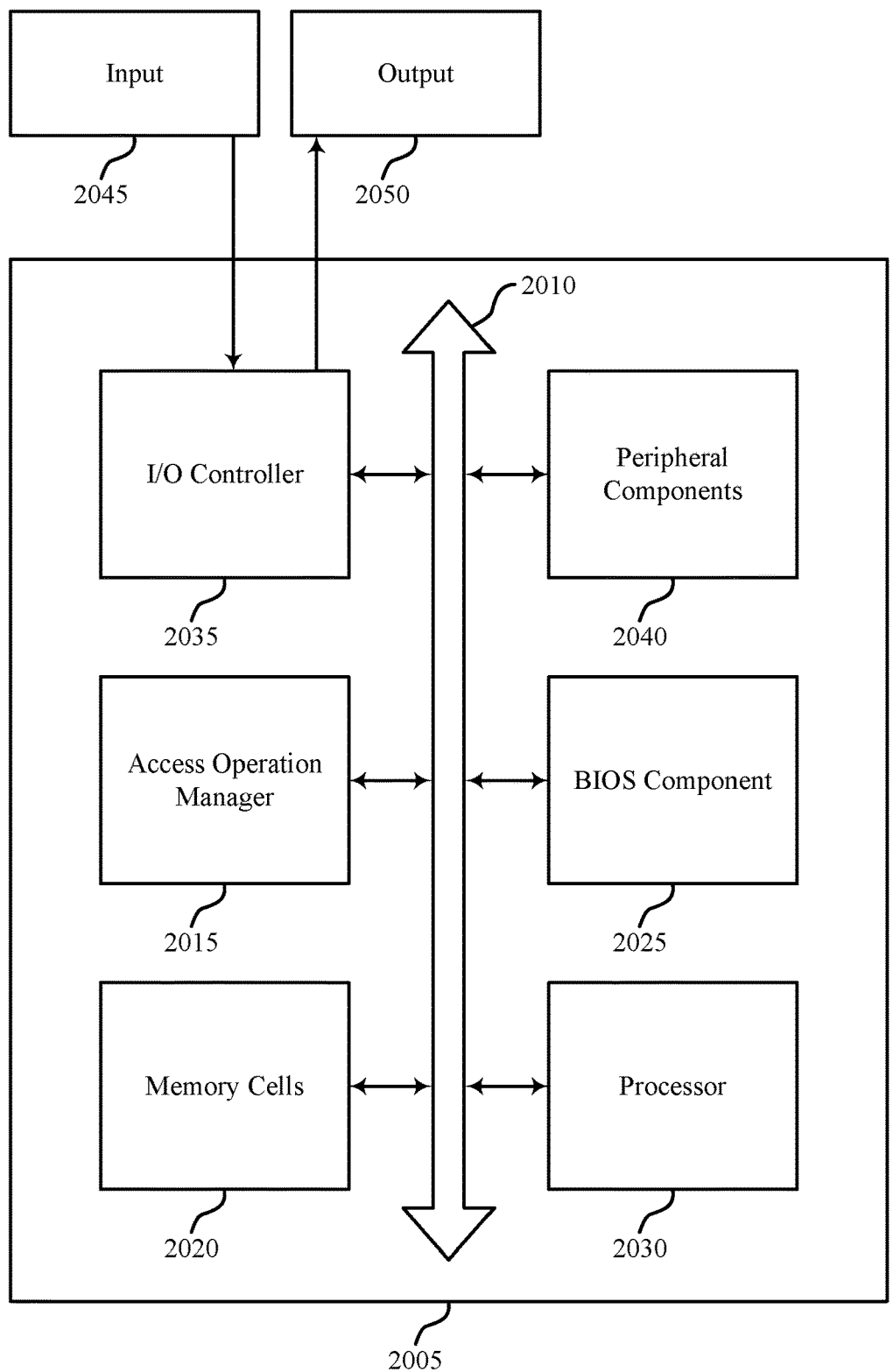
FIG. 20 shows a block diagram of a system including a device that supports active boundary quilt architecture memory in accordance with embodiments of the present disclosure.

FIG. 20 shows a block diagram of a system 2000 including a device 2005 that supports active boundary quilt architecture memory in accordance with embodiments of the present disclosure. Device 2005 may be an example of or include the components of memory controller 140 as described above, e.g., with reference to FIGS. 1 and 2. Device 2005 may include components for bi-directional data communications including components for transmitting and receiving communications, including access operation manager 2015, memory cells 2020, basic input/output system (BIOS) component 2025, processor 2030, I/O controller 2035, and peripheral components 2040. These components may be in electronic communication via one or more busses (e.g., bus 2010).

Memory cells 2020 may store information (i.e., in the form of a logical state) as described herein. BIOS component 2025 may be a software component that includes BIOS operations as firmware, which may initialize and run various hardware components. BIOS component 2025 may also manage data flow between a processor and various other components, e.g., peripheral components, input/output (I/O) controller, etc. BIOS component 2025 may include a program or software stored in read only memory (ROM), flash memory, or any other non-volatile memory.

Processor 2030 may include an intelligent hardware device (e.g., a general-purpose processor, a digital signal processor (DSP), a central processing unit (CPU), a microcontroller, an application-specific integrated circuit (ASIC), an field-programmable gate array (FPGA), a programmable logic device, a discrete gate or transistor logic component, a discrete hardware component, or any combination thereof). In some cases, processor 2030 may be configured to operate a memory array using a memory controller. In other cases, a memory controller may be integrated into processor 2030. Processor 2030 may be configured to execute computer-readable instructions stored in a memory to perform various functions (e.g., functions or tasks supporting active boundary quilt architecture memory).

I/O controller 2035 may manage input and output signals for device 2005. I/O controller 2035 may also manage peripherals not integrated into device 2005. In some cases, I/O controller 2035 may represent a physical connection or port to an external peripheral. In some cases, I/O controller 2035 may utilize an operating system such as iOS®, ANDROID®, MS-DOS®, MS-WINDOWS®, OS/2®, UNIX®, LINUX®, or another known operating system.

Peripheral components 2040 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input 2045 may represent a device or signal external to device 2005 that provides input to device 2005 or its components. This may include a user interface or an interface with or between other devices. In some cases, input 2045 may be managed by I/O controller 2035, and may interact with device 2005 via a peripheral component 2040.

Output 2050 may also represent a device or signal external to device 2005 configured to receive output from device 2005 or any of its components. Examples of output 2050 may include a display, audio speakers, a printing device, another processor or printed circuit board, etc. In some cases, output 2050 may be a peripheral element that interfaces with device 2005 via peripheral component(s) 2040. In some cases, output 2050 may be managed by I/O controller 2035.

The components of device 2005 may include circuitry designed to carry out their functions. This may include various circuit elements, for example, conductive lines, transistors, capacitors, inductors, resistors, amplifiers, or other active or inactive elements, configured to carry out the functions described herein. Device 2005 may be a computer, a server, a laptop computer, a notebook computer, a tablet computer, a mobile phone, a wearable electronic device, a personal electronic device, or the like. Or device 2005 may be a portion or element of such a device.

Figure 21:
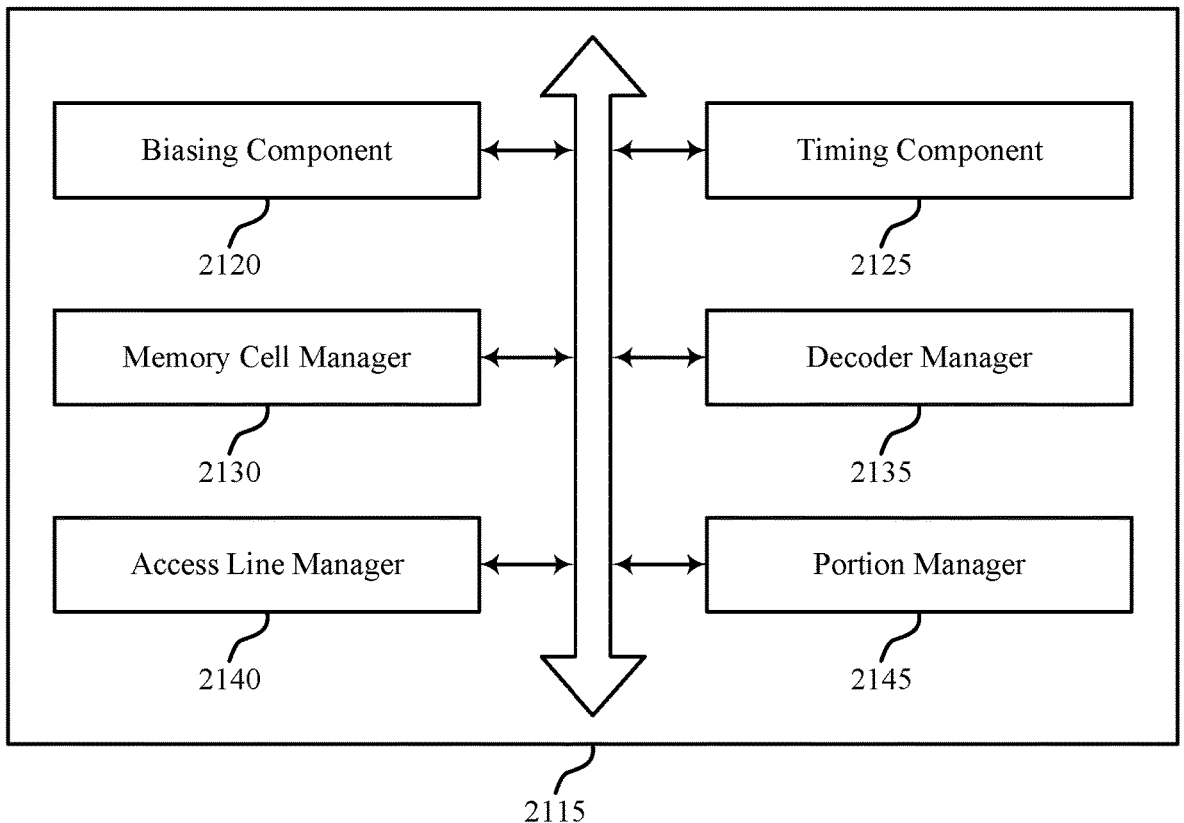
FIG. 21 shows a block diagram of an access operation manager that supports active boundary quilt architecture memory in accordance with embodiments of the present disclosure.

FIG. 21 shows a block diagram 2100 of an access operation manager 2115 that supports active boundary quilt architecture memory in accordance with embodiments of the present disclosure. The access operation manager 2115 may be an example of embodiments of an access operation manager 2015 described with reference to FIG. 20. The access operation manager 2115 may include biasing component 2120, timing component 2125, memory cell manager 2130, decoder manager 2135, access line manager 2140, and portion manager 2145. Each of these modules may communicate, directly or indirectly, with one another (e.g., via one or more buses).

Memory cell manager 2130 may identify at least one cell of an array of memory cells that overlies a first boundary portion and a second boundary portion of a substrate layer, where memory cells of the array are coupled with a first plurality of decoders of the first boundary portion, a second plurality of decoders of the second boundary portion, and a third plurality of decoders of a core portion of the substrate layer via a plurality of access lines, and where the first plurality of decoders includes a plurality of column decoders associated with memory cells of the array that overlie the first boundary portion and the second plurality of decoders includes a plurality of column decoders associated with memory cells of the array that overlie the second boundary portion.

Decoder manager 2135 may access the at least one cell using decoders of the core portion, the first boundary portion, and the second boundary portion.

Access line manager 2140 may be configured to manage access lines such as row lines or column lines. In some cases, the access line manager accesses the at least one cell using one of the first plurality of decoders of the first boundary portion, one of the second plurality of decoders of the second boundary portion, or one of the third plurality of decoders of the core portion in conjunction with a column decoder of a boundary portion above which the at least one cell is located.

Portion manager 2145 may be configured to manage various parts of the memory device. In some cases, accessing the at least one cell includes: activating an access line coupled between the at least one cell and a decoder of one of the first boundary portion or the second boundary portion or a decoder of the core portion, and a column connected to the column decoder of the boundary portion above which the at least one cell is located. In some cases, accessing the at least one cell includes: accessing the array of memory cells that overlaps the first boundary portion of the substrate layer, accessing the array of memory cells that overlaps the second boundary portion of the substrate layer, and accessing the array of memory cells that overlaps the core portion of the substrate layer.

FIG. 22 shows a flowchart illustrating a method 2200 that supports active boundary quilt architecture memory in accordance with embodiments of the present disclosure. The operations of method 2200 may be implemented by a memory controller 140 or its components as described herein. For example, the operations of method 2200 may be performed by an access operation manager as described with reference to FIGS. 20 and 21. In some examples, a memory controller 140 may execute a set of codes to control the functional elements of the device to perform the functions described below. Additionally or alternatively, the memory controller 140 may perform some of the functions described below using special-purpose hardware.

In some cases, the method may also include identifying at least one cell of an array of memory cells that overlies a first boundary portion and a second boundary portion of a substrate layer, where memory cells of the array are coupled with a first plurality of decoders of the first boundary portion, a second plurality of decoders of the second boundary portion, and a third plurality of decoders of a core portion of the substrate layer via a plurality of access lines, and where the first plurality of decoders includes a plurality of column decoders associated with memory cells of the array that overlie the first boundary portion and the second plurality of decoders includes a plurality of column decoders associated with memory cells of the array that overlie the second boundary portion. In some cases, the method may also include accessing the at least one cell using one of the first plurality of decoders of the first boundary portion, one of the second plurality of decoders of the second boundary portion, or one of the third plurality of decoders of the core portion in conjunction with a column decoder of a boundary portion above which the at least one cell is located.

In some cases, the substrate layer includes the core portion, the first boundary portion, the second boundary portion, and a control circuit portion, where the core portion comprises a first border and a second border positioned opposite to the first border, the first border adjoining the first boundary portion and the second border adjoining the second boundary portion, where the array of memory cells overlies the core portion and at least a part of the first boundary portion and the second boundary portion of the substrate layer; the core portion of the substrate layer includes a plurality of sections that each include a common configuration of components, and where each section of the core portion includes a plurality of regions that each are indexed to represent a subset of column addresses; the first boundary portion of the substrate layer including a plurality of sections that each include a same configuration of components as other sections of the first boundary portion, where the sections of the first boundary portion have a different configuration of components from the sections of the core portion, and where each section of the first boundary portion includes a plurality of regions that each are indexed to represent a subset of column addresses; and the second boundary portion of the substrate layer includes a plurality of sections that each include a same configuration of components as other sections of the second boundary portion, where the sections of the second boundary portion have a different configuration of components from the sections of the first boundary portion and the sections of the core portion, and where each section of the second boundary portion comprises a plurality of regions that each are indexed to represent a subset of column addresses.

In some cases, accessing the at least one cell includes activating an access line coupled between the at least one cell and a decoder of one of the first boundary portion or the second boundary portion or a decoder of the core portion, and a column connected to the column decoder of the boundary portion above which the at least one cell is located. In some cases, accessing the at least one cell includes accessing the array of memory cells that overlies the first boundary portion of the substrate layer, accessing the array of memory cells that overlies the second boundary portion of the substrate layer, and accessing the array of memory cells that overlies the core portion of the substrate layer. In some cases, the method further includes identifying at least one group of regions with a same index from the first boundary portion, the second boundary portion, and the core portion; and accessing a plurality of memory cells associated with the at least one group using one of the first plurality of decoders, one of the second plurality of decoders, and one of the third plurality of decoders in conjunction with column decoders identified by column addresses within the at least one group. In some cases, the method further includes scrambling the indices associated with regions for a plurality of groups that includes the at least one group, where the scrambling produces a uniform number of outputs throughout the plurality of groups.

At block 2205 the memory controller 140 may identify at least one cell of an array of memory cells that overlies a first boundary portion and a second boundary portion of a substrate layer, where memory cells of the array are coupled with a first plurality of decoders of the first boundary portion, a second plurality of decoders of the second boundary portion, and a third plurality of decoders of a core portion of the substrate layer via a plurality of access lines, and where the first plurality of decoders includes a plurality of column decoders associated with memory cells of the array that overlie the first boundary portion and the second plurality of decoders includes a plurality of column decoders associated with memory cells of the array that overlie the second boundary portion. The operations of block 2205 may be performed according to the methods described with reference to FIGS. 1 through 21. In certain examples, embodiments of the operations of block 2205 may be performed by a memory cell manager as described with reference to FIG. 21.

At block 2210 the memory controller 140 may access the at least one cell using one of the first plurality of decoders of the first boundary portion, one of the second plurality of decoders of the second boundary portion, or one of the third plurality of decoders of the core portion in conjunction with a column decoder of a boundary portion above which the at least one cell is located. The operations of block 2210 may be performed according to the methods described with reference to FIGS. 1 through 21. In certain examples, embodiments of the operations of block 2210 may be performed by a decoder manager as described with reference to FIG. 21.

It should be noted that the methods described above describe possible implementations, and that the operations and the steps may be rearranged or otherwise modified and that other implementations are possible. Furthermore, features or steps from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The term "electronic communication" refers to a relationship between components that supports electron flow between the components. This may include a direct connection between components or may include intermediate components. Components in electronic communication may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication regardless of the state of the switch (i.e., open or closed).

The term "isolated" refers to a relationship between components in which electrons are not presently capable of flowing between them; components are isolated from each other if there is an open circuit between them. For example, two components physically connected by a switch may be isolated from each other when the switch is open.

As used herein, the term "shorting" refers to a relationship between components in which a conductive path is established between the components via the activation of a single intermediary component between the two components in question. For example, a first component shorted to a second component may exchange electrons with the second component when a switch between the two components is closed. Thus, shorting may be a dynamic operation that enables the flow of charge between components (or lines) that are in electronic communication.

The devices discussed herein, including memory device 100, may be formed on a semiconductor substrate, such as silicon (Si), germanium, silicon-germanium alloy, gallium arsenide (GaAs), gallium nitride (GaN), etc. In some cases, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

Chalcogenide materials may be materials or alloys that include at least one of the elements S, Se, and Te. Phase change materials discussed herein may be chalcogenide materials. Chalcogenide materials may include alloys of S, Se, Te, Ge, As, Al, Sb, Au, indium (In), gallium (Ga), tin (Sn), bismuth (Bi), palladium (Pd), cobalt (Co), oxygen (O), silver (Ag), nickel (Ni), platinum (Pt). Example chalcogenide materials and alloys may include, but are not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, or Ge—Te—Sn—Pt. The hyphenated chemical composition notation, as used herein, indicates the elements included in a particular compound or alloy and is intended to represent all stoichiometries involving the indicated elements. For example, Ge—Te may include $Ge_xTe_y$, where x and y may be any positive integer. Other examples of variable resistance materials may include binary metal oxide materials or mixed valence oxide including two or more metals, e.g., transition metals, alkaline earth metals, and/or rare earth metals. Embodiments are not limited to a particular variable resistance material or materials associated with the memory elements of the memory cells. For example, other examples of variable resistance materials can be used to form memory elements and may include chalcogenide materials, colossal magnetoresistive materials, or polymer-based materials, among others.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
   a memory array comprising layered decks of memory cells;
   a core portion of a substrate that forms a layer below the memory array, the core portion comprising a tile with a first arrangement of decoders and sense amplifiers configured to access memory cells in the decks of memory cells;
   a first boundary portion of the substrate adjacent to the core portion, the first boundary portion comprising a second arrangement of decoders and sense amplifiers configured to access memory cells in the decks of memory cells, the second arrangement matching a first subsection of the first arrangement; and
   a second boundary portion of the substrate adjacent to the core portion, the second boundary portion comprising a third arrangement of decoders and sense amplifiers configured to access memory cells in the decks of memory cells, the third arrangement matching a second subsection of the first arrangement that is different than the first subsection.

2. The apparatus of claim 1, wherein the first subsection of the first arrangement is at a border of the tile opposite the first boundary portion.

3. The apparatus of claim 1, wherein first arrangement comprises one or more column line decoders coupled with one or more column lines that extend over the tile and the second arrangement excludes column line decoders.

4. The apparatus of claim 3, wherein the first arrangement and the second arrangement each comprise one or more row decoders for multiple decks in the memory array, and wherein the first boundary portion is configured to access memory cells that are directly over the tile.

5. The apparatus of claim 1, wherein the decks of memory cells extend over the core portion and the first boundary portion.

6. The apparatus of claim 1, wherein first arrangement and the second arrangement each comprise column line decoders and row decoders configured to access memory cells in the decks of the memory array.

7. The apparatus of claim 6, further comprising:
a first set of column lines extending over the tile and coupled with respective column line decoders of the tile; and
a second set of column lines extending over the first boundary portion and coupled with respective column line decoders of the first boundary portion.

8. The apparatus of claim 6, wherein the first boundary portion is configured to access memory cells that are directly over the tile as well as memory cells that are directly above the first boundary portion.

9. An apparatus, comprising:
a memory array comprising layered decks of memory cells;
a core portion of a substrate that forms a layer below the memory array, the core portion comprising a tile with a first arrangement of decoders and sense amplifiers configured to access memory cells in the decks of memory cells;
a boundary portion of the substrate adjacent to the tile, the boundary portion comprising a second arrangement of decoders and sense amplifiers configured to access memory cells in the decks of memory cells, the second arrangement matching a subsection of the first arrangement;
row lines for a first deck extending over the boundary portion and the tile in a first direction, wherein the row lines for the first deck bridge a gap between the boundary portion and the tile;
row lines for a second deck extending over the boundary portion and the tile in the first direction, wherein the row lines for the second deck bridge the gap between the boundary portion and the tile; and
column lines extending over the tile in a second direction different than the first direction.

10. The apparatus of claim 9, further comprising:
additional column lines extending over the boundary portion in the second direction.

11. An apparatus, comprising:
a core portion of a substrate comprising a first tile and a second tile, the first tile and the second tile comprising a same first arrangement of decoders and sense amplifiers;
a first boundary portion of the substrate adjacent to the first tile, the first boundary portion comprising a second arrangement of decoders and sense amplifiers; and
a second boundary portion adjacent to the second tile, the second boundary portion comprising a third arrangement of decoders and sense amplifiers, the third arrangement mirroring the second arrangement of decoders and sense amplifiers.

12. The apparatus of claim 11, wherein the second arrangement matches a subsection of the first arrangement at a first border of the first tile and the third arrangement matches a subsection of the first arrangement at a second border of the first tile, wherein the first and second borders are opposite each other.

13. The apparatus of claim 11, wherein the core portion of the substrate comprises a third tile comprising the first arrangement, the apparatus further comprising:
a third boundary portion adjacent to the first boundary portion, the third boundary portion comprising the second arrangement.

14. The apparatus of claim 13, wherein the core portion of the substrate comprises a fourth tile comprising the first arrangement, the apparatus further comprising:
a fourth boundary portion adjacent to the fourth boundary portion, the fourth boundary portion comprising the third arrangement.

15. The apparatus of claim 11, further comprising:
a memory array comprising layered decks of memory cells, wherein the first boundary portion is configured to access memory cells positioned directly over the first tile and the second boundary portion is configured to access memory cells directly over the second tile.

16. The apparatus of claim 15, wherein the first boundary portion is configured to access memory cells positioned directly over the first boundary portion and the second boundary portion is configured to access memory cells positioned directly over the second boundary portion.

17. An apparatus, comprising:
a memory array comprising a memory deck positioned over a substrate in a first direction, the memory deck comprising memory cells;
a core portion of the substrate, the core portion comprising a tile with a first plurality of decoders configured to access a first set of the memory cells in a portion of the memory deck that is positioned directly over the first plurality of decoders in the first direction; and
a boundary portion of the substrate adjacent to the tile, the boundary portion comprising a second plurality of decoders configured to access a second set of the memory cells in a portion of the memory deck that is positioned directly over the first plurality of decoders in the first direction and configured to access a third set of memory cells in a portion of the memory deck that is positioned directly over the second plurality of decoders in the first direction.

18. The apparatus of claim 17, wherein the first plurality of decoders comprises row decoders and column decoders in a first arrangement, and wherein the second plurality of decoders comprises row line decoders and column line decoders in a second arrangement that matches a subsection of the first arrangement.

19. The apparatus of claim 18, wherein the core portion comprises a first plurality of sense amplifiers in a third arrangement and the boundary portion comprises a second plurality of sense amplifiers in a fourth arrangement that matches a subsection of the third arrangement.

20. The apparatus of claim 17, wherein the first plurality of decoders is configured to access a fourth set of the memory cells that is positioned directly over second tile adjacent to the tile.

* * * * *